US008623715B2

(12) United States Patent
Nishida et al.

(10) Patent No.: US 8,623,715 B2
(45) Date of Patent: Jan. 7, 2014

(54) METHOD FOR FABRICATING THIN-FILM SEMICONDUCTOR DEVICE FOR DISPLAY

(71) Applicant: Panasonic Corporation, Osaka (JP)

(72) Inventors: Kenichirou Nishida, Osaka (JP); Hisao Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/679,313

(22) Filed: Nov. 16, 2012

(65) Prior Publication Data
US 2013/0071972 A1 Mar. 21, 2013

Related U.S. Application Data

(63) Continuation of application No. PCT/JP2011/002582, filed on May 10, 2011.

(30) Foreign Application Priority Data

May 20, 2010 (JP) ................................ 2010/003404

(51) Int. Cl.
H01L 21/84 (2006.01)
H01L 29/66 (2006.01)

(52) U.S. Cl.
USPC ............................ 438/151; 438/149; 438/161

(58) Field of Classification Search
USPC ........................................................ 438/151
See application file for complete search history.

(56) References Cited

U.S. PATENT DOCUMENTS

| 5,466,641 A | 11/1995 | Shimizu et al. |
| 6,187,616 B1 | 2/2001 | Gyoda |
| 6,246,070 B1 | 6/2001 | Yamazaki et al. |
| 6,838,324 B2 | 1/2005 | Yamazaki et al. |
| 6,844,523 B2 | 1/2005 | Yamazaki et al. |
| 7,320,905 B2 | 1/2008 | Yamazaki et al. |

(Continued)

FOREIGN PATENT DOCUMENTS

| JP | 62-252166 | 11/1987 |
| JP | 04-037035 | 2/1992 |

(Continued)

OTHER PUBLICATIONS

U.S. Appl. No. 13/632,607 to Yuji Kishida et al., filed Oct. 1, 2012.

(Continued)

Primary Examiner — Angel Roman
(74) Attorney, Agent, or Firm — Greenblum & Bernstein, P.L.C.

(57) ABSTRACT

A method for fabricating a thin-film semiconductor device for display according to the present disclosure includes: preparing a glass substrate; forming, above the glass substrate, an undercoat layer including a nitride film; forming a molybdenum metal layer above the undercoat layer; forming a gate electrode from the metal layer by an etching process; forming a gate insulating film above the gate electrode; forming a non-crystalline silicon layer as a non-crystalline semiconductor layer above the gate insulating film; forming a polycrystalline semiconductor layer which is a polysilicon layer by annealing the non-crystalline silicon layer at a temperature in a range from 700° C. to 1400° C.; forming a source electrode and a drain electrode above the polysilicon layer; and performing hydrogen plasma treatment at a stage after the metal layer is formed and before the polysilicon layer is formed, using a radio frequency power in a range from 0.098 W/cm² to 0.262 W/cm².

16 Claims, 17 Drawing Sheets

(56) References Cited

U.S. PATENT DOCUMENTS

| | | | |
|---|---|---|---|
| 8,049,215 | B2 | 11/2011 | Jinbo et al. |
| 8,174,009 | B2 | 5/2012 | Komatsu et al. |
| 8,310,152 | B2 | 11/2012 | Yoshida et al. |
| 2001/0029069 | A1 | 10/2001 | Yamazaki et al. |
| 2003/0080100 | A1 | 5/2003 | Yamazaki et al. |
| 2005/0116225 | A1* | 6/2005 | Yamazaki et al. ............. 257/58 |
| 2007/0259486 | A1* | 11/2007 | Makita ........................ 438/166 |
| 2009/0267067 | A1 | 10/2009 | Jinbo et al. |
| 2012/0032179 | A1 | 2/2012 | Saitoh et al. |
| 2012/0231589 | A1 | 9/2012 | Saito |

FOREIGN PATENT DOCUMENTS

| | | |
|---|---|---|
| JP | 06-045607 | 2/1994 |
| JP | 06-283423 | 10/1994 |
| JP | 09-293870 | 11/1997 |
| JP | 2002-329701 | 11/2002 |
| JP | 2003-158076 | 5/2003 |
| JP | 2008-098653 | 4/2008 |
| JP | 2009-283930 | 12/2009 |
| WO | 99/41777 | 8/1999 |

OTHER PUBLICATIONS

U.S. Appl. No. 13/556,542 to Tatsuya Yamada, filed Jul. 24, 2012.

International Search Report in PCT/JP2011/002582, dated Aug. 2, 2011.

International Search Report in PCT/JP2010/003404, dated Jul. 13, 2010.

* cited by examiner

CW laser

Laser oscillation state

Excimer laser (pulse)

400 μm

Laser oscillation state 30 ns

Energy J

Time t

METHOD FOR FABRICATING THIN-FILM SEMICONDUCTOR DEVICE FOR DISPLAY

CROSS REFERENCE TO RELATED APPLICATIONS

This is a continuation application of PCT Patent Application No. PCT/JP2011/002582 filed on May 10, 2011, designating the United States of America, which is based on and claims priority of PCT Patent Application No. PCT/JP2010/003404 filed on May 20, 2010. The entire disclosures of the above-identified applications, including the specifications, drawings and claims are incorporated herein by reference in their entirety.

TECHNICAL FIELD

One or more exemplary embodiments disclosed herein relate generally to methods for fabricating thin-film semiconductor devices for driving active matrix liquid crystal displays or organic EL displays, and particularly to a method for fabricating a thin-film semiconductor device for display using a polysilicon layer as a channel layer.

BACKGROUND ART

Conventionally, in active-matrix flat-panel displays (FPD) such as liquid crystal displays or organic EL displays, thin-film semiconductor devices for display (hereafter simply referred to as a "thin-film semiconductor device") also referred to as thin-film transistors (TFT) have been used for driving pixels.

Among the displays, the organic EL displays are current-driven devices unlike voltage-driven liquid crystal displays. Accordingly, there is an urgent need for developing a thin-film semiconductor device having excellent on-off characteristics as a driving circuit in an active matrix display device.

Conventionally, as a thin-film semiconductor device for the driving circuit in the liquid crystal display, a thin-film semiconductor device using a single-layer non-crystalline semiconductor layer (amorphous semiconductor layer) such as amorphous silicon as a channel layer has been used. This type of thin-film semiconductor device has a large band gap, and thus the off-state current is low. However, there is a problem that the on-state current is low as well due to low mobility.

There is another thin-film semiconductor device for the driving circuit in the liquid crystal display, in which a single-layer polycrystalline semiconductor layer has been used as the channel layer. This type of thin-film semiconductor device has high mobility of carriers and thus has a large on-state current, contrary to the thin-film semiconductor device using the single-layer non-crystalline semiconductor layer as the channel layer. However, there is a problem that the off-state current is also high due to the high carrier mobility.

In view of these problems, in the driving circuit of the organic EL display, a thin-film semiconductor device in which a two-layered structure including a first channel layer made of polycrystalline semiconductor layer and a second channel layer made of a non-crystalline semiconductor layer has been developed.

The patent literature 1 discloses a method for forming the polycrystalline semiconductor layer. The method for forming the polycrystalline semiconductor layer disclosed in the patent literature 1 features crystallizing an amorphous silicon film by annealing a substrate on which the amorphous silicon film is formed at a temperature in a range from 800° C. to 1000° C.

CITATION LIST

Patent Literature

[Patent Literature 1] WO1999/041777

SUMMARY

Technical Problem

There is a problem in the conventional thin-film semiconductor device that molybdenum used as a gate electrode causes flake-offs on the gate electrode. The present disclosure has been conceived in view of the problem, and one non-limiting and exemplary embodiment provides a method for fabricating a thin-film semiconductor device capable of inhibiting generation of flake-offs on the gate electrode even if molybdenum is used as the gate electrode.

Solution to Problem

In one general aspect, the method for fabricating the thin-film semiconductor device for display disclosed here feature a method for fabricating a thin-film semiconductor device for display, the method including: preparing a glass substrate; forming, above the glass substrate, an undercoat layer for inhibiting diffusion of an impurity in the glass substrate, the undercoat layer including a nitride film; forming a metal layer including molybdenum above the undercoat layer; forming a gate electrode from the metal layer by a predetermined etching process; forming a gate insulating film above the gate electrode; forming a non-crystalline silicon layer above the gate insulating film; forming a polysilicon layer by annealing the non-crystalline silicon layer at a temperature in a range from 700° C. to 1400° C., the non-crystalline silicon layer being crystallized by the annealing; forming a source electrode and a drain electrode above the polysilicon layer; and performing hydrogen plasma treatment at least once at a stage after the metal layer is formed and before the polysilicon layer is formed, the hydrogen plasma treatment being performed toward at least a region in the undercoat layer on which the gate electrode is formed, in which a radio frequency power when performing the hydrogen plasma treatment is in a range from 0.098 W/cm$^2$ to 0.262 W/cm$^2$.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the method for fabricating the thin-film semiconductor device for display according to the present disclosure, it is possible to inhibit the oxidation of molybdenum comprising the gate electrode. Therefore, it is possible to inhibit the generation of the flake-offs on the gate electrode.

BRIEF DESCRIPTION OF DRAWINGS

These and other advantages and features will become apparent from the following description thereof taken in conjunction with the accompanying Drawings, by way of non-limiting examples of embodiments of the present disclosure.

DESCRIPTION OF EMBODIMENT(S)

As described above, in the conventional method for fabricating the thin-film semiconductor device using the single-layer non-crystalline semiconductor layer as the channel layer, there is no high-temperature process. Accordingly, the maximum processing temperature falls within approximately 350° C. at a maximum.

In contrast, in the method for fabricating the thin-film semiconductor device including the polycrystalline semiconductor layer as the channel layer, a process for crystallizing the amorphous silicon film by annealing is necessary. A high temperature treatment at a temperature in a range higher than or equal to 700° C. is necessary for the annealing.

Figure 18A:
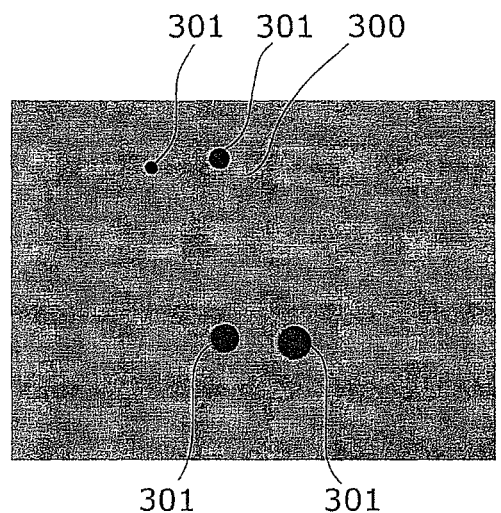
FIG. 18A is a microscopic image of flake-off in the gate electrode captured by an optical microscope.

According to the results of the experiment conducted by the inventors, where the thin-film semiconductor device including the polysilicon layer as the channel layer was fabricated using molybdenum as the material for the gate electrode and annealing the non-crystalline silicon layer for crystallization at a temperature in a range from 700° C. to 1400° C. using a continuous wave laser, multiple circular flake-offs in various sizes were generated on the gate electrode, as illustrated in FIG. 18A. FIG. 18A is a microscopic image of the flake-offs on the gate electrode captured by an optical microscope in a top view of the thin-film semiconductor device.

Figure 18B:
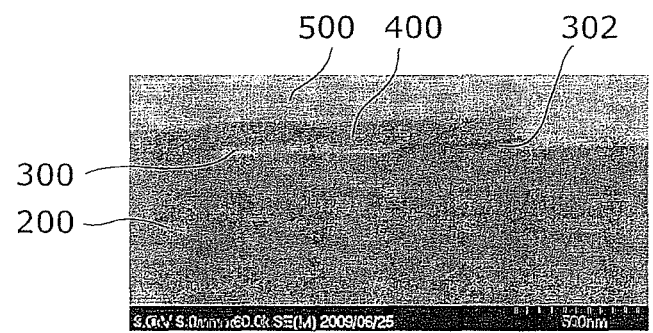
FIG. 18B is a cross-sectional SEM image capturing the flake-off around the gate electrode in a cross-sectional view of the thin-film semiconductor device.

As illustrated in FIG. 18A, multiple circular flake-offs 301 on the gate electrode 300 were observed. FIG. 18B is a cross-sectional SEM image capturing a flake-off around the gate electrode in a cross-sectional view of the thin-film semiconductor device in this case. As illustrated in FIG. 18B, a gap 302 was observed in the gate electrode 300 made of molybdenum tungsten on the undercoat layer 200 which is a silicon nitride film. With this, part of the gate insulating film 400 and the polycrystalline semiconductor layer 500 above the gate electrode 300 flakes off. As described above, in the bottom-gate thin-film semiconductor device, when a high-temperature annealing is present after the gate electrode is formed, there is a case in which circular flake-off appears on the gate electrode.

If the thin-film semiconductor device having the flake-off is used as a thin-film transistor, even if a predetermined voltage is applied to the gate electrode, the part with the flake-off does not function as the gate electrode. Consequently, the desired characteristics of the thin-film transistor cannot be achieved, and the function as the thin-film transistor is significantly degraded.

As described above, there is a problem in the thin-film semiconductor device including the polysilicon layer as the channel layer. The problem is that using molybdenum as the gate electrode causes flake-offs on the gate electrode.

In one general aspect, the method for fabricating the thin-film semiconductor device for display disclosed here feature a method for fabricating a thin-film semiconductor device for display, the method including: preparing a glass substrate; forming, above the glass substrate, an undercoat layer for inhibiting diffusion of an impurity in the glass substrate, the undercoat layer including a nitride film; forming a metal layer including molybdenum above the undercoat layer; forming a gate electrode from the metal layer by a predetermined etching process; forming a gate insulating film above the gate electrode; forming a non-crystalline silicon layer above the gate insulating film; forming a polysilicon layer by annealing the non-crystalline silicon layer at a temperature in a range from 700° C. to 1400° C., the non-crystalline silicon layer being crystallized by the annealing; forming a source electrode and a drain electrode above the polysilicon layer; and performing hydrogen plasma treatment at least once at a stage after the metal layer is formed and before the polysilicon layer is formed, the hydrogen plasma treatment being performed toward at least a region in the undercoat layer on which the gate electrode is formed, in which a radio frequency power when performing the hydrogen plasma treatment is in a range from 0.098 W/cm$^2$ to 0.262 W/cm$^2$.

With this, it is possible to reduce the concentration of oxygen present in the proximity of the interface between the undercoat layer and the gate electrode or in the proximity of the interface between the undercoat layer and the metal layer. Accordingly, even if molybdenum is included in the material composing the gate electrode, it is possible to inhibit the generation of molybdenum oxide. Therefore, even is annealing at a high temperature in a range from 700° C. to 1400° C. is performed, it is possible to inhibit the generation of the flake-offs on the gate electrode.

In an aspect of the method for fabricating thin-film semiconductor device for display according to the embodiment, the undercoat layer has a thickness of at least 100 nm, for example.

With this, the undercoat layer can effectively inhibit the diffusion of sodium.

In an aspect of the method for fabricating thin-film semiconductor device for display according to the embodiment, the undercoat layer has a thickness of at least 400 nm, for example.

With this, it is possible to form a highly reliable undercoat layer without cracks.

In an aspect of the method for fabricating thin-film semiconductor device for display according to the embodiment, a concentration of oxygen atoms in the undercoat layer is in a range from $1 \times 10^{18}$/cm$^3$ to $1 \times 10^{21}$/cm$^3$, for example.

With this, oxygen atoms contained in the undercoat layer are diffused to a barrier layer, reducing the concentration of the oxygen atoms contained in the undercoat layer.

In an aspect of the method for fabricating thin-film semiconductor device for display according to the embodiment, when performing the hydrogen plasma treatment, a processing time using the radio frequency power is in a range from 15 seconds to 60 seconds, for example.

In an aspect of the method for fabricating thin-film semiconductor device for display according to the embodiment, the hydrogen plasma treatment is performed toward an interface between the undercoat layer and the gate electrode, for example.

With this, it is possible to perform hydrogen plasma treatment on the interface between the undercoat layer and the gate electrode after patterning.

In an aspect of the method for fabricating thin-film semiconductor device for display according to the embodiment, the hydrogen plasma treatment is treatment for reducing a concentration of oxygen in proximity of the interface between the undercoat layer and the gate electrode, for example.

With this, it is possible to reduce the concentration of oxygen in the proximity of the interface between the undercoat layer and the gate electrode, and thus it is possible to inhibit the generation of molybdenum oxide. Therefore, even if annealing at a high temperature is performed, it is possible to inhibit the generation of the flake-offs on the gate electrode.

In an aspect of the method for fabricating thin-film semiconductor device for display according to the embodiment, the impurity in the glass substrate is sodium or phosphorus, for example.

With this, the undercoat layer inhibits impurity such as sodium or phosphorus contained in the glass substrate from entering the silicon layer.

In an aspect of the method for fabricating thin-film semiconductor device for display according to the embodiment, the glass substrate contains oxygen atoms as a major component, the undercoat layer has a force for bonding with oxygen atoms that is weaker than the glass substrate, and the molybdenum has a force for bonding with oxygen atoms that is weaker than the glass substrate and stronger than the undercoat layer, for example.

Consequently, molybdenum is more likely to be oxidized than the undercoat layer; the hydrogen plasma treatment can inhibit the oxidation of molybdenum.

In an aspect of the method for fabricating thin-film semiconductor device for display according to the embodiment, forming a second non-crystalline silicon layer above the polysilicon layer between forming the polysilicon layer and forming the source electrode and drain electrode is included, in which the source electrode and the drain electrode are formed above the second non-crystalline silicon layer, for example.

With this, it is possible to form the non-crystalline silicon layer between (i) the polysilicon layer and (ii) the source electrode or the drain electrode.

In an aspect of the method for fabricating thin-film semiconductor device for display according to the embodiment, the polysilicon layer includes a microcrystalline silicon layer having an average grain size in a range from 20 nm to 200 nm, for example.

Since the polysilicon layer is the microcrystalline silicon layer having the average grain size in a range from 20 nm to 200 nm, the carrier mobility is higher than an amorphous semiconductor. Accordingly, a thin-film semiconductor device having better on-characteristics can be achieved.

In an aspect of the method for fabricating thin-film semiconductor device for display according to the embodiment, the hydrogen plasma treatment is performed between forming the gate electrode and forming the gate insulating film, for example.

After the etching for forming the gate electrode, the concentration of oxygen at the interface of the gate electrode is high, and there is no process involving oxygen in a period after the gate electrode forming process and before the gate insulating film forming process since there is no cleaning process. Accordingly, by performing the hydrogen plasma treatment at this stage, the gate electrode is covered by the gate insulating film, at a low concentration of oxygen. Thus, the annealing at a high temperature in a range from 700° C. to 1400° C. can be performed in a state where there is the smallest amount of oxygen at the interface between the undercoat layer and the gate electrode. This aspect can reduce the oxygen concentration at the interface of the gate electrode most effectively.

In an aspect of the method for fabricating thin-film semiconductor device for display according to the embodiment, the hydrogen plasma treatment is performed between forming the gate insulating film and forming the non-crystalline silicon layer, for example.

With this, the gate electrode has already been covered with the gate insulating film at the time of hydrogen plasma treatment. Accordingly, it is possible to inhibit oxygen entering the interface between the gate electrode and the undercoat layer again after this stage.

In an aspect of the method for fabricating thin-film semiconductor device for display according to the embodiment, the hydrogen plasma treatment is performed between forming the non-crystalline silicon layer and forming the polysilicon layer, for example.

With this, the gate electrode has already been covered with the gate insulating film and the non-crystalline silicon layer at the time of hydrogen plasma treatment. Accordingly, it is possible to inhibit oxygen from entering the interface between the gate electrode and the undercoat layer again after this stage. Furthermore, the hydrogen plasma treatment can be performed immediately before the annealing. Accordingly, it is possible to effectively reduce the concentration of oxygen at the interface of the gate electrode.

In an aspect of the method for fabricating thin-film semiconductor device for display according to the embodiment, the hydrogen plasma treatment is performed between forming the metal layer and forming the gate electrode, for example.

Even if the gate electrode is still in the form of the metal layer before patterning, the concentration of oxygen at the interface between the gate metal layer and the undercoat layer is reduced. Accordingly, it is possible to reduce the concentration of oxygen at the interface between the undercoat layer and the gate electrode to be formed afterward.

Furthermore, when forming the polysilicon layer, the non-crystalline silicon layer is annealed using a continuous wave laser, for example.

Since the laser annealing using the continuous wave laser has longer heat input time than the pulse laser, the temperature at the interface between the gate electrode and the undercoat layer becomes higher, making the flake-offs more likely to be generated. Accordingly, the present disclosure is particularly effective when the non-crystalline silicon layer is crystallized using the continuous wave laser.

The following shall describe the method for fabricating the thin-film semiconductor device for display according to the present disclosure with reference to the embodiments.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of appended Claims and their equivalents. Therefore, among the structural elements in the following exemplary embodiments, structural elements not recited in any one of the independent claims are described as arbitrary structural elements.

(Configuration of Thin-Film Semiconductor Device for Display)

Figure 1:
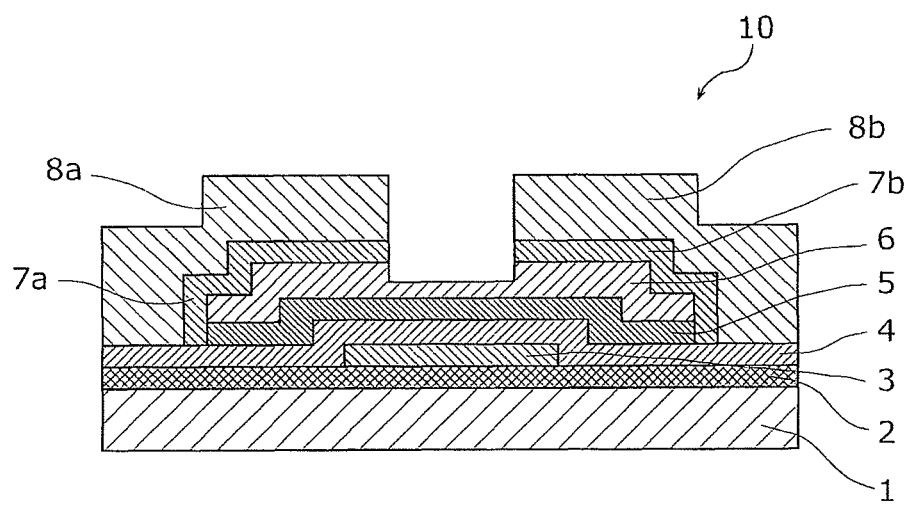
FIG. 1 is a cross-sectional view schematically illustrating a thin-film semiconductor device for display according to embodiments.

First, a thin-film semiconductor device for display according to embodiments shall be described with reference to FIG. 1. FIG. 1 is a cross-sectional view schematically illustrating a thin-film semiconductor device for display according to embodiments.

As illustrated in FIG. 1, the thin-film semiconductor device for display 10 according to the embodiments is a bottom-gate thin-film transistor device, and includes a glass substrate 1, and the following layers sequentially formed above the glass substrate 1; an undercoat layer 2, a gate electrode 3, a gate insulating film 4, a polycrystalline semiconductor layer 5, a non-crystalline semiconductor layer 6, a pair of contact layers 7a and 7b, and a source electrode 8a and a drain electrode 8b, which constitutes a pair.

The glass substrate 1 is composed of a glass material such as quartz glass, for example.

The undercoat layer 2 is formed on the surface of the glass substrate 1 for inhibiting impurity such as sodium or phosphorus included in the glass substrate 1 from entering the semiconductor layer. The impurity in the glass substrate 1 is included in the process of forming the glass substrate 1 itself.

As the material for the undercoat layer 2, a nitride film such as silicon nitride (SiN) may be used, for example. Note that, as the material for the undercoat layer 2, it is possible to use a different insulating film such as silicon dioxide. However, a nitride film such as a silicon nitride film is used for inhibiting the entrance of the impurity in the glass substrate 1 from entering into the semiconductor layer, for example. By having the thickness of approximately 100 nm, the silicon nitride film can sufficiently inhibit the dispersion of the impurity in the glass substrate 1 to outside of the glass substrate 1.

The gate electrode 3 is formed of a metal including molybdenum (Mo) such as molybdenum tungsten (MoW), and is formed on the undercoat layer 2. The thickness of the gate electrode 3 is approximately 50 nm.

The gate insulating film 4 is composed of silicon dioxide ($SiO_2$), silicon nitride (SiN) or a stacked film of these materials, and is formed on the glass substrate 1 and the gate electrode 3, covering the gate electrode 3. In this embodiment, the polycrystalline semiconductor layer 5 is used as a channel layer. Accordingly, silicon dioxide is used as the gate insulating film 4, for example. The reason for this is that it is preferable to have good interface state between the gate insulating film 4 and the channel layer for maintaining excellent threshold voltage characteristics of the TFT, and silicon dioxide is suitable for this purpose. Note that the thickness of the gate insulating film 4 is approximately in a range from 100 to 150 nm.

The polycrystalline semiconductor layer 5 is a first channel layer formed on the gate insulating film 4, and is a polysilicon layer in this embodiment. Note that, the polycrystalline semiconductor layer 5 includes a microcrystalline semiconductor layer (microcrystalline silicon layer) having an average grain size in a range from 20 nm to 200 nm. The polycrystalline semiconductor layer 5 is a crystallized silicon layer formed by crystallizing amorphous silicon, and has microcrystalline structure referred to as micro crystals.

The non-crystalline semiconductor layer 6 is a second channel layer formed on the polycrystalline semiconductor layer 5, and is composed of a non-crystalline silicon layer such as an amorphous silicon layer, for example.

As described above, the thin-film semiconductor device for display 10 according to this embodiment includes a two-layered channel layer having the first channel layer composed of the polycrystalline semiconductor layer 5 and the second channel layer composed of the non-crystalline semiconductor layer 6. Note that, the polycrystalline semiconductor layer 5 and the non-crystalline semiconductor layer 6 are formed in island shape in a plan view.

The pair of contact layers 7a and 7b is composed of an amorphous semiconductor layer containing impurity at high concentration, and is formed on the non-crystalline semiconductor layer 6. Note that the contact layer 7a and the contact layer 7b are formed apart from each other. Each of the contact layers 7a and 7b is formed to cover the upper surface and a side surface of an end portion of the non-crystalline semiconductor layer 6 and a side surface of the polycrystalline semiconductor layer 5, and is formed from the upper surface of the non-crystalline semiconductor layer 6 to a surface above the glass substrate 1. In this embodiment, each of the contact layers 7a and 7b is an n-type semiconductor layer in which amorphous silicon is doped with phosphorus (P) as the impurity, and is an $n^+$ layer including a high concentration of impurity of at least $1 \times 10^{19}$ ($atm/cm^3$).

The source electrode 8a and the drain electrode 8b which constitutes a pair are formed on the contact layers 7a and 7b, respectively, and are formed apart from each other. The source electrode 8a and the drain electrode 8b are made of single-layer structure or a multi-layer structure of a conductive material, an alloy including the conductive material, or the like, and are made of, for example, aluminum (Al), molybdenum (Mo), tungsten (W), copper (Cu), titanium (Ti), chromium (Cr), or others. In this embodiment, the source electrode 8a and the drain electrode 8b are formed as a tri-layer structure of MoW/Al/MoW.

The following shall describe the method for fabricating the thin-film semiconductor device for display 10 with reference to the embodiments.

Embodiment 1

First, a method for fabricating a thin-film semiconductor device for display according to the embodiment 1 shall be described with reference to FIG. 2 to FIG. 4. Note that, as the reference numerals of the components in this embodiment, the same reference numerals as the components of the thin-film semiconductor device for display 10 illustrated in FIG. 1 are used.

Figure 2:
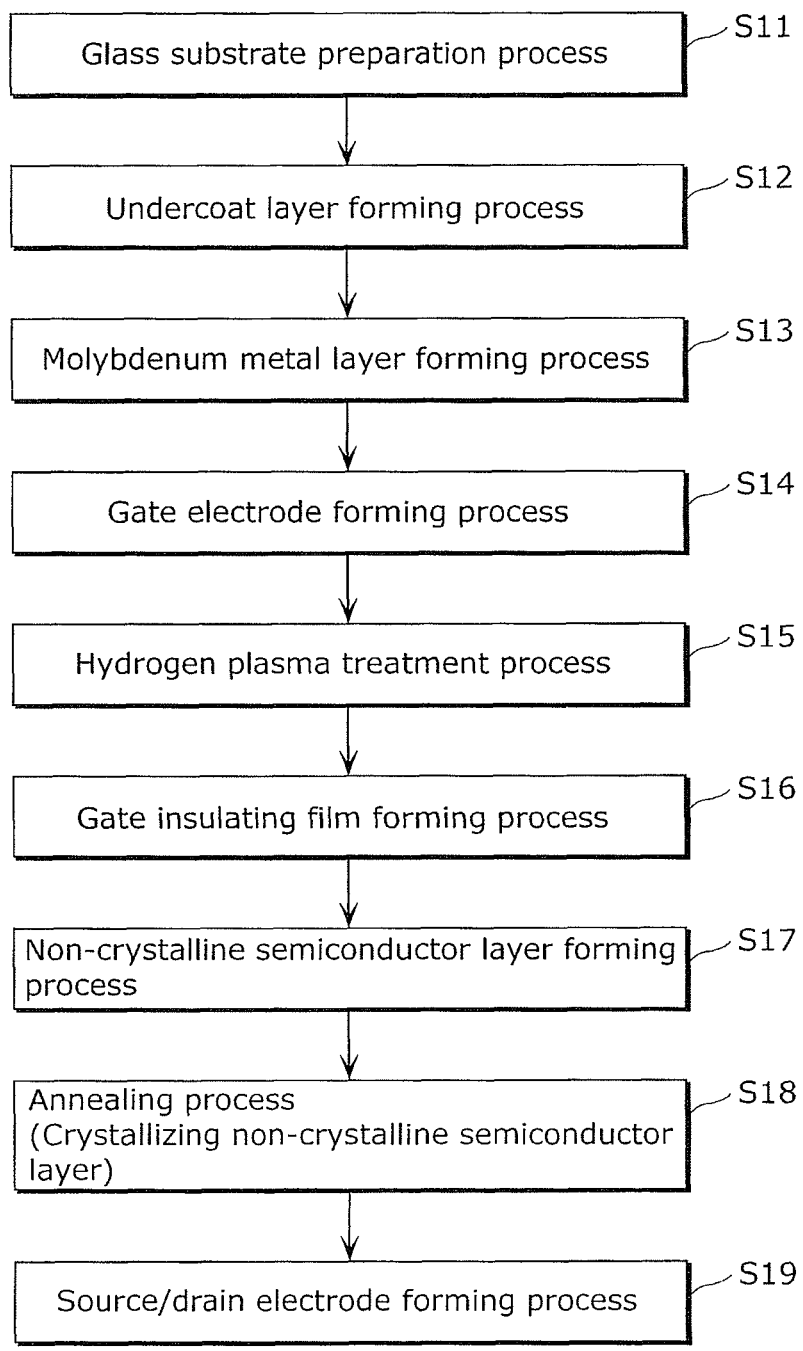
FIG. 2 is a flowchart illustrating a method for fabricating a thin-film semiconductor device for display according to the embodiment 1.

FIG. 2 is a flowchart illustrating the method for fabricating the thin-film semiconductor device for display 10 according to the embodiment 1.

As illustrated in FIG. 2, the method for fabricating the thin-film semiconductor device for display according to the embodiment 1 includes at least a glass substrate preparation process (S11), an undercoat layer forming process (S12), a molybdenum metal layer forming process (S13), a gate electrode forming process (S14), a hydrogen plasma treatment process (S15), a gate insulating film forming process (S16), a non-crystalline semiconductor layer forming process (S17), an annealing process (S18), and a source/drain electrode forming process (S19) in order.

The glass substrate preparation process (S11) is a process for preparing a predetermined glass substrate.

The undercoat layer forming process (S12) is a process for forming the undercoat layer 2 on the glass substrate 1.

The molybdenum metal layer forming process (S13) is a process for forming a molybdenum metal layer composed of a material containing molybdenum, which is a material for the gate electrode 3 on the undercoat layer 2.

The gate electrode forming process (S14) is a process for forming the gate electrode 3 by patterning the molybdenum metal layer by predetermined etching process.

The hydrogen plasma treatment process (S15) is a process for hydrogen reduction treatment by generating hydrogen plasma using a predetermined radio frequency power.

The gate insulating film forming process (S16) is a process for forming the gate insulating film 4 on the gate electrode 3.

The non-crystalline semiconductor layer forming process (S17) is a process for forming a first non-crystalline semiconductor layer such as an amorphous silicon layer on the gate insulating film 4.

The annealing process (S18) is a process for annealing the non-crystalline semiconductor layer on the gate insulating film 4 at a temperature in a predetermined range. The non-crystalline semiconductor layer is crystallized by the annealing process, forming the polycrystalline semiconductor layer 5.

The source/drain electrode forming process (S19) is a process for forming the source electrode 8a and the drain electrode 8b above the polycrystalline semiconductor layer 5.

Note that, the method for fabricating the thin-film semiconductor device according to the embodiment 1 includes processes in addition to the processes described above.

Note that, a specific method for fabricating the thin-film semiconductor device for display according to the embodiment 1 shall be described in more detail with reference to FIG. 3 and FIG. 4 including the processes not described above. FIG. 3 and FIG. 4 are cross-sectional views schematically illustrating a thin-film semiconductor device for display according to the embodiment 1.

(Glass Substrate Preparation Process: S11)

Figure 3:
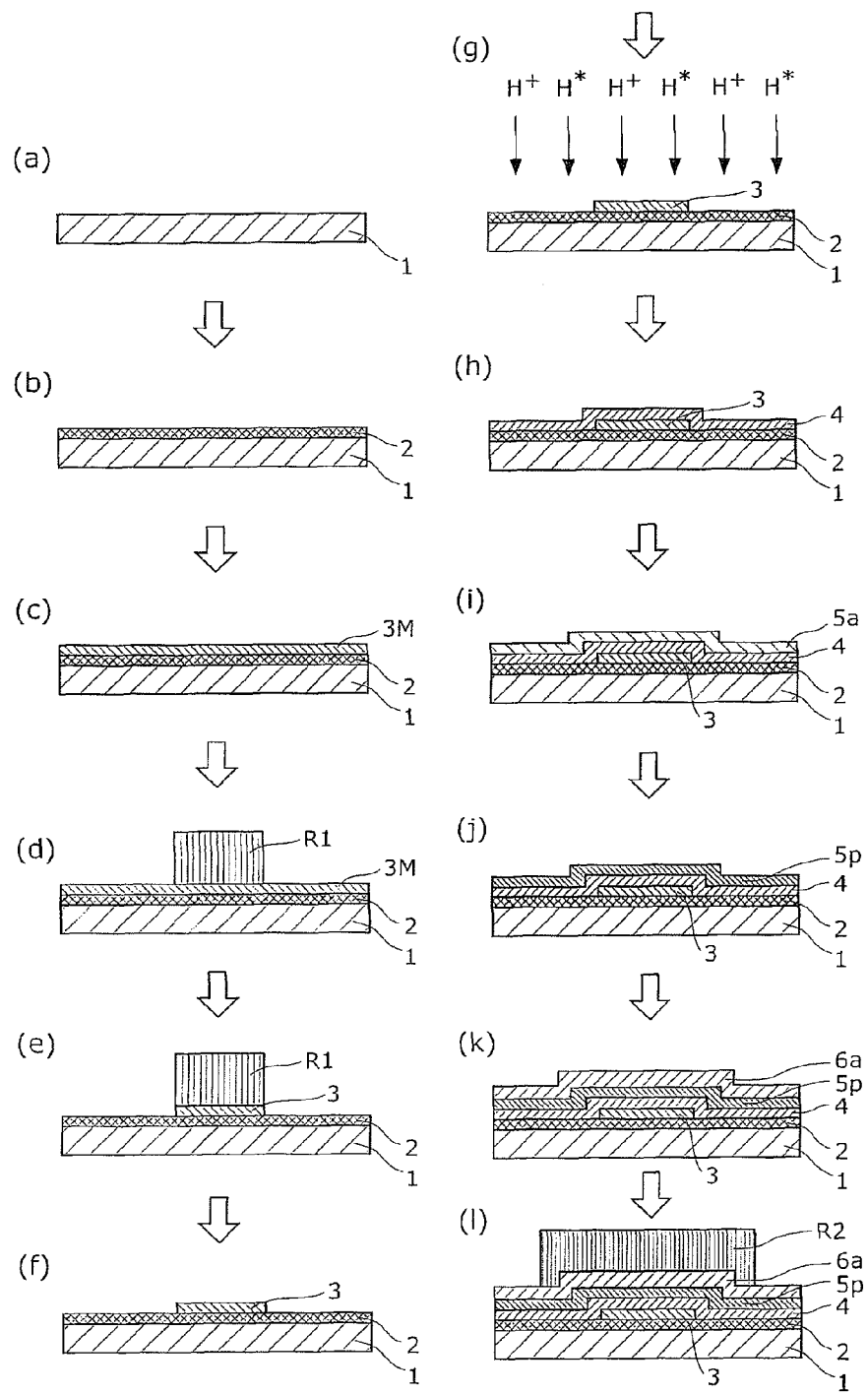
FIG. 3 is a cross-sectional view schematically illustrating processes in the method for fabricating the thin-film semiconductor device for display according to the embodiment 1.

First, as illustrated in (a) in FIG. 3, the glass substrate made of a glass material such as quartz glass is prepared. Note that, the glass substrate 1 is cleaned, for example.

(Undercoat Layer Forming Process: S12)

Next, as illustrated in (b) in FIG. 3, the undercoat layer 2 which is an insulating film made of the silicon nitride film is formed on the glass substrate 1. The silicon nitride film can be formed by the plasma CVD. The thickness of the undercoat layer 2 is approximately 100 nm.

(Molybdenum Metal Layer Forming Process: S13)

Next, after cleaning the surface by pure water or others, a molybdenum metal layer 3M (gate metal layer) formed of a material containing molybdenum is formed on the undercoat layer 2, as illustrated in (c) in FIG. 3. In this embodiment, molybdenum tungsten (MoW) is used as the molybdenum metal layer 3M. Furthermore, the molybdenum metal layer 3M is deposited by sputtering.

(Gate Electrode Forming Process: S14)

Next, resist is applied on the molybdenum metal layer 3M and the resist is exposed to light and developed such that the resist remains in a part where the gate electrode is to be formed, and the resist R1 is selectively formed.

Next, as illustrated in FIG. 3 (e), wet etching is performed using the remaining resist R1 as a mask, patterning the molybdenum metal layer 3M. Subsequently, by removing the resist and cleaning the surface, the gate electrode 3 in the predetermined shape is formed on the undercoat layer 2, as illustrated in (f) in FIG. 3.

(Hydrogen Plasma Treatment Process: S15)

Next, the glass substrate 1 above which the gate electrode 3 is formed on the undercoat layer 2 is placed in a chamber, and hydrogen plasma treatment is performed toward the undercoat layer 2 at least on a region where the gate electrode 3 is formed (gate electrode forming region), as illustrated in (g) in FIG. 3. In this embodiment, the hydrogen plasma treatment is performed toward the interface between the undercoat layer 2 and the gate electrode 3.

The hydrogen plasma treatment features generating hydrogen ion ($H^+$) and hydrogen radical ($H^*$) in a plasma atmosphere by a predetermined radio frequency power. By the hydrogen ion and hydrogen radical generated, oxygen in the proximity of inside and outside of the oxidized gate electrode 3 and in the atmosphere can be removed. Stated differently, the hydrogen ion and the hydrogen radial enter the interface between the undercoat layer 2 and the gate electrode 3. Oxygen present inside of the gate electrode 3 and an area near the gate electrode 3 is combined with the hydrogen ion and the hydrogen radical, and oxygen turns into moisture, which is then evaporated and released. With this, it is possible to reduce the concentration of oxygen present in the proximity of the interface between the undercoat layer 2 and the gate electrode 3.

(Gate Insulating Film Forming Process: S16)

Next, as illustrated in (h) in FIG. 3, the gate insulating film 4 made of silicon dioxide having the thickness of approximately 100 nm is deposited on the gate electrode 3 and the exposed part of the undercoat layer 2 so as to cover the gate electrode 3. The gate insulating film 4 can be deposited by the plasma CVD or others.
(First Non-Crystalline Semiconductor Layer Forming Process: S17)

Next, as illustrated in (i) in FIG. 3, the non-crystalline semiconductor layer 5a made of a non-crystalline silicon layer is deposited on the gate insulating film 4 as the first non-crystalline semiconductor layer. In this embodiment, the non-crystalline semiconductor layer 5a is an amorphous silicon layer, and is deposited to have the thickness of approximately 50 nm by the plasma CVD or others.
(Annealing Process: S18)

After the dehydrogenation annealing at 500° C. is performed, crystallization annealing is performed on the non-crystalline semiconductor layer 5a at a temperature in a range from 700° C. to 1400° C. With this, the non-crystalline semiconductor layer 5a which is the non-crystalline silicon layer is crystallized, and the polycrystalline semiconductor layer 5p which is the polysilicon layer is formed, as illustrated in (j) in FIG. 3.

The crystallization annealing in the embodiment is laser annealing using a continuous wave laser (CW laser). Unlike the annealing using the pulse laser, the annealing using the CW laser is performed by continuously irradiating the non-crystalline silicon layer to be crystallized with laser.

As described above, by performing laser annealing on the non-crystalline silicon layer, amorphous silicon is crystallized, forming the polysilicon layer having microcrystalline structure having micro crystals.

Note that, the crystallization annealing using the CW laser is performed for a time of 0.1 μsec at a temperature higher than or equal to a melting temperature of non-crystalline silicon (1100° C.), for example.
(Second Non-Crystalline Semiconductor Layer Forming Process)

Next, after the hydrogenation by the hydrogen plasma treatment using $H_2$, the non-crystalline semiconductor layer 6a made of non-crystalline silicon layer as the second non-crystalline semiconductor layer is deposited on the polycrystalline semiconductor layer 5p, as illustrated in (k) in FIG. 3. In this embodiment, the non-crystalline semiconductor layer 6a is an amorphous silicon layer, and is deposited to have the thickness of approximately 100 nm by the plasma CVD or others.
(Channel Layer Island Forming Process)

Next, a resist is applied on the non-crystalline semiconductor layer 6a, and the resist is exposed to light and developed. As a result, a resist R2 is selectively formed, such that a part on which the channel layer is to be formed remains.

Next, dry etching is performed using the remaining resist R2 as a mask, so as to pattern the non-crystalline semiconductor layer 6a and the polycrystalline semiconductor layer 5p. As a result, the polycrystalline semiconductor layer 5 and the non-crystalline semiconductor layer 6 which have island shape are formed, as illustrated in (a) in FIG. 4. Subsequently, as illustrated in (b) in FIG. 4, by removing the resist and cleaning the surface, the channel layer in island shape having two-layered structure including the first channel layer which is the polycrystalline semiconductor layer 5, the lower layer, and the second channel layer which is the non-crystalline semiconductor layer 6, the upper layer.
(Contact Layer Forming Film Forming Process)

Figure 4:
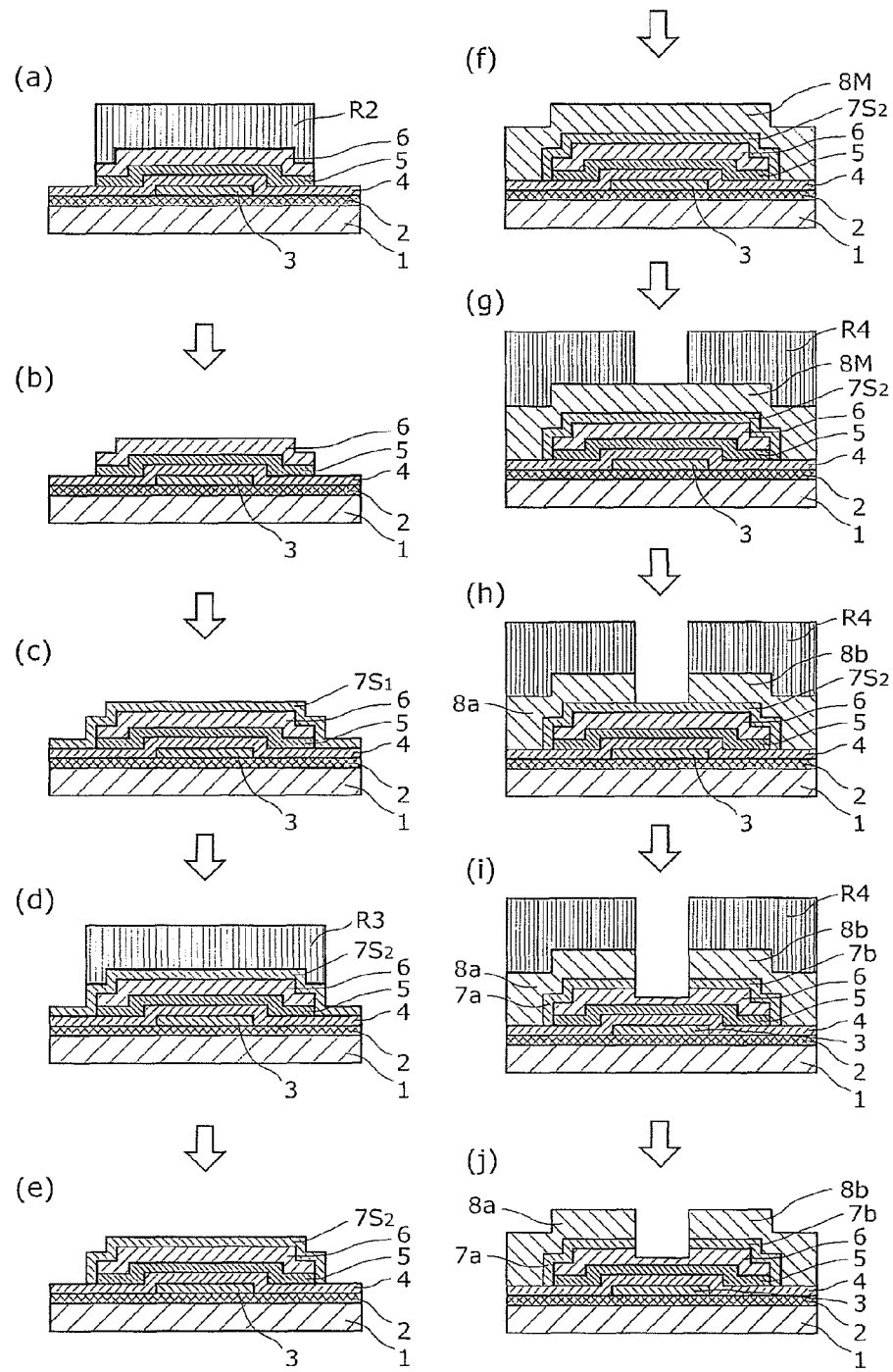
FIG. 4 is a cross-sectional view schematically illustrating processes in the method for fabricating the thin-film semiconductor device for display according to the embodiment 1.

Next, as illustrated in (c) in FIG. 4, an amorphous semiconductor layer $7S_1$ to be the contact layer made of the amorphous silicon layer doped with impurity is deposited on the non-crystalline semiconductor layer 6 and the glass substrate 1 by the plasma CVD or others. A pentavalent element such as phosphorus can be used as the impurity, for example. In addition, the flow rate of the gas is adjusted such that the concentration of the impurity is high.

Next, in order to form the contact layer in the predetermined shape, a resist is applied on the amorphous semiconductor layer $7S_1$ doped with impurity at high concentration, and the resist is exposed to light and developed. As a result, the resist R3 in the predetermined shape is selectively formed, as illustrated in (d) in FIG. 4. Subsequently, dry etching is performed using the resist R3 as a mask for patterning the amorphous semiconductor layer $7S_1$ doped with impurity at high concentration. Here, the amorphous semiconductor layer $7S_1$ doped with impurity at high concentration is patterned to cover the upper surface and the side surfaces of the non-crystalline semiconductor layer 6 and the side surfaces of the polycrystalline semiconductor layer 5, forming an amorphous semiconductor layer $7S_2$ doped with impurity at high concentration, which is a contact layer forming film. Subsequently, as illustrated in (e) in FIG. 4, by removing the resist R3 and cleaning the surface, the amorphous semiconductor layer $7S_2$ doped with impurity at high concentration, which is the contact layer forming film, is exposed.
(Source/Drain Electrode Forming Process: S19)

Next, the source/drain metal film 8M made of a material composing the source electrode 8a and the drain electrode 8b is deposited on the amorphous semiconductor layer $7S_2$ doped with impurity at high concentration and on the glass substrate 1, as illustrated in (f) in FIG. 4. In this embodiment, the source/drain metal film 8M is formed by sputtering as a tri-layer structure of MoW/Al/MoW.

Next, resist is applied on the source/drain metal film 8M for forming the source electrode 8a and the drain electrode 8b in the predetermined shape, and the resist is exposed to light and developed, so as to selectively form a resist R4 in the predetermined shape as illustrated in (g) in FIG. 4.

Next, wet etching is performed using the resist R4 as a mask for patterning the source/drain metal film 8M. As a result, the source electrode 8a and the drain electrode 8b in the predetermined shape are formed, as illustrated in (h) in FIG. 4. Note that, here, the amorphous semiconductor layer $7S_2$ doped with impurity at high concentration functions as an etching stopper.
(Contact Layer Forming Process/Channel Etching Process)

Next, as illustrated in (i) in FIG. 4, dry etching is performed using the resist R4 as a mask so as to etch the amorphous semiconductor layer $7S_2$ doped with impurity at high concentration which is exposed, and to etch the upper layer of the non-crystalline semiconductor layer 6. By separating the amorphous semiconductor layer $7S_2$ doped with impurity as described above, a pair of contact layers 7a and 7b which is a pair of $n^+$ layers is formed. Furthermore, etching the upper layer of the non-crystalline semiconductor layer 6, the channel layer having a desired thickness is formed.

Subsequently, by removing the resist R4 and cleaning the surface, the thin-film semiconductor device for display according to the embodiment 1 is complete, as illustrated in (j) in FIG. 4.

Note that, although not illustrated, a passivation film may be formed to cover the entire thin-film semiconductor device for display.
(Actions and Effects of the Present Disclosure)

Figure 5:
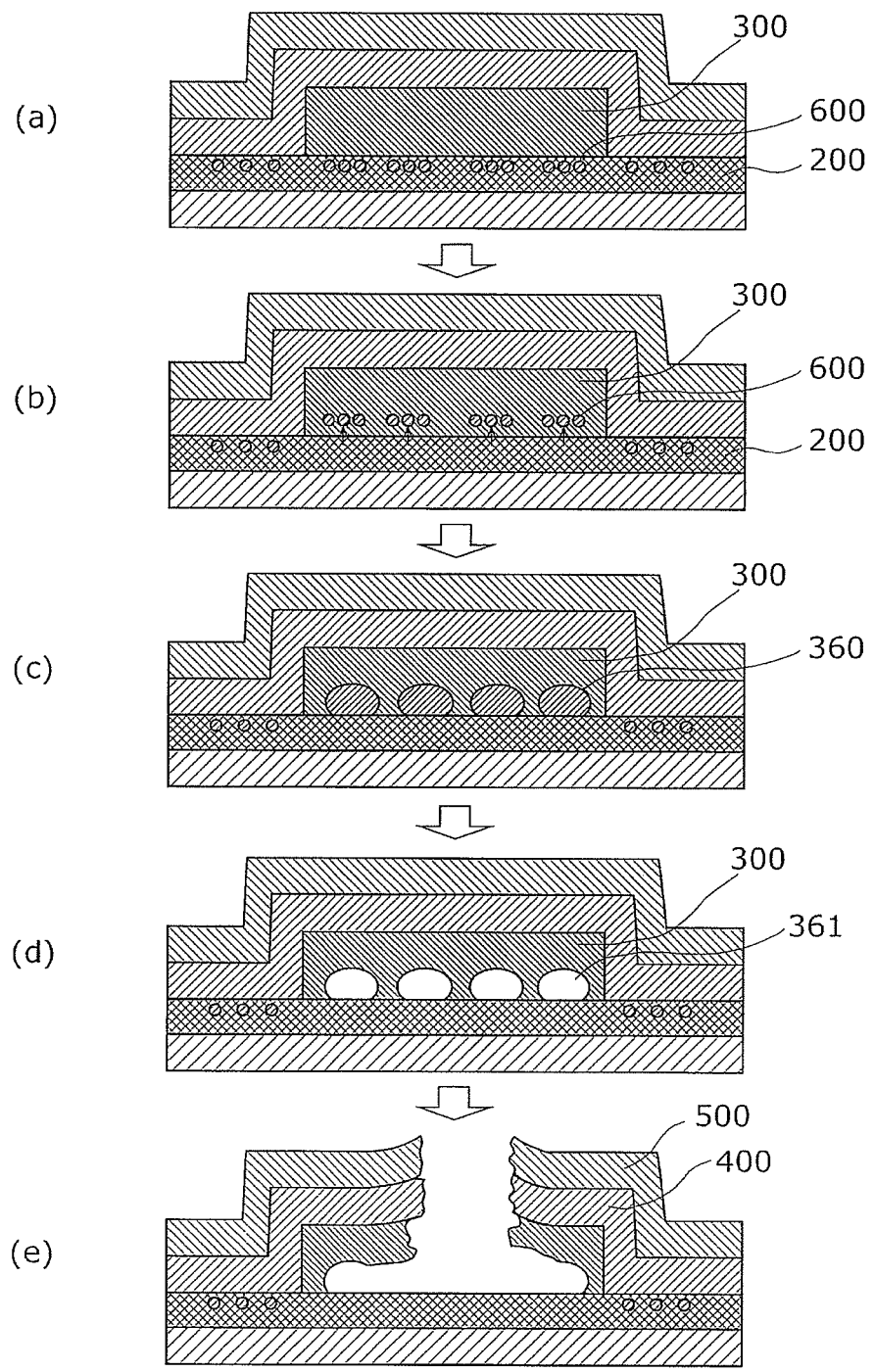
FIG. 5 is a schematic diagram for describing a cause of flake-off in the thin-film semiconductor device for display.

Next, actions and effects in the method for fabricating the thin-film semiconductor device for display according to the embodiment 1 shall be described in detail with reference to FIG. 5. FIG. 5 is a schematic diagram for describing a cause of flake-off in the thin-film semiconductor device for display.

As described above, in the conventional thin-film semiconductor device for display, the non-crystalline semiconductor layer is crystallized by annealing the non-crystalline semiconductor layer (non-crystalline silicon layer) using the CW laser for forming the polycrystalline semiconductor layer (polysilicon layer) at a temperature in a range from 700° C. to 1400° C. However, as illustrated in FIG. 18A, there is a problem that the annealing causes flake-offs in various sizes on the gate electrode.

After diligent consideration on the mechanism of the problem, the inventors found out that the problem is caused for the following reasons.

First, there is a case in which molybdenum oxide ($MoO_3$) is formed when molybdenum is used as the material for the gate electrode, and the inventors found out the problem is caused by molybdenum oxide. More specifically, if molybdenum oxide is formed in the gate electrode, molybdenum oxide sublimes by annealing at a temperature in a range from 700° C. to 1400° C. and turn into gas. This is because molybdenum oxide has a melting point of approximately 800° C. and has a tendency to sublime. With this, gas is present inside and around the gate electrode, making the film formed on the gate electrode likely to fall off.

After consideration on the cause of the formation of the molybdenum oxide, the inventors found out that the undercoat layer present under the gate electrode is the cause. The following shall specifically describe the cause.

The undercoat layer is formed for inhibiting the negative influence of the glass board, which is the substrate, on the thin-film semiconductor device. More specifically, impurities such as sodium or phosphorus are included in the forming process of the glass board itself. However, if the impurities such as sodium or phosphorus enter the semiconductor layer in the channel layer, the impurities function as electric charges, causing leakage current and a shift of threshold voltage to a negative side. The undercoat layer is formed to block the impurities in the glass board entering the semiconductor layer. As the undercoat layer, a nitride film such as silicon nitride is usually used for blocking the entering impurity more effectively.

The inventors found out that, when a gate electrode containing molybdenum is directly formed on the silicon nitride film, a layer rich in oxygen having a high oxygen content rate is formed on the surface of the silicon nitride film in any process for fabricating the thin-film semiconductor device. Stated differently, as illustrated in (a) in FIG. 5, it is assumed that the layer rich in oxygen containing more oxygen atoms 600 than another region exists in the proximity of the undercoat layer 200 which is the nitride film, that is, in an upper layer of the undercoat layer 200 or between the undercoat layer 200 and the gate electrode 300.

In terms of the force for bonding with the oxygen atoms, molybdenum has a bonding force for bonding with oxygen atoms greater than the nitride film. Accordingly, the oxygen atoms below the gate electrode 300 among the oxygen atoms 600 present in the proximity of the surface of the undercoat layer 200 which is a nitride film are diffused toward the gate electrode 300 containing molybdenum, as illustrated in (b) in FIG. 5.

With this, as illustrated in (c) in FIG. 5, the diffused oxygen atoms 600 are combined with molybdenum of the gate electrode 300, forming molybdenum oxide 360. Note that, the nitride film has a smaller force for bonding with the oxygen atoms than the glass substrate. In addition, although molybdenum has a weaker bonding force with the oxygen atoms than the glass substrate, molybdenum has a larger bonding force with the oxygen atoms than the nitride film.

As described above, the bonding force with the oxygen atoms is higher in molybdenum than in the nitride film. Accordingly, molybdenum is more likely to be oxidized than the nitride film, and thus molybdenum oxide 360 is formed by the diffused oxygen atoms 600.

In this state, in order to crystallize the non-crystalline semiconductor layer, annealing at a temperature in a range from 700° C. to 1400° C. is performed. Here, as illustrated in (d) in FIG. 5, the molybdenum oxide 360 sublimes and turns into gas. Accordingly, gas 361 is present inside and around the gate electrode 300.

Subsequently, as illustrated in (e) in FIG. 5, when the gas 361 is released from inside the gate electrode 300, the gate insulating film 400 and the polycrystalline semiconductor layer 500 above the gate electrode 300 flake off.

More specifically, since the CW laser has a longer heat input time than the pulse laser, when annealing the non-crystalline semiconductor layer for crystallization using the CW laser, the temperature at the interface between the undercoat layer 200 and the gate electrode 300 increases, causing the flake-offs to be more likely generated.

The present disclosure has been conceived in order to solve the problem, and according to the method for fabricating the thin-film semiconductor device for display 10 according to the embodiment 1, the hydrogen plasma treatment is performed before annealing the non-crystalline semiconductor layer. With this, oxygen in the proximity of inside and outside of the oxidized gate electrode 3 and in the atmosphere can be removed. With this, it is possible to reduce the concentration of oxygen present in the proximity of the interface between the undercoat layer 2 and the gate electrode 3.

Accordingly, even when molybdenum having a greater bonding force with oxygen atoms than the undercoat layer 2 is used as the material for the gate electrode 3, it is possible to make the oxidization of molybdenum caused by the oxygen layer present in the proximity of the interface between the undercoat layer 2 and the gate electrode 3 less likely to be occurred. Furthermore, in this state, even if the gate insulating film 4 and the non-crystalline semiconductor layer 5a are formed on the gate electrode 3, and the non-crystalline semiconductor layer 5a is annealed for crystallization at a predetermined temperature for annealing, the number of oxygen atoms to be bonded with molybdenum inside and around the gate electrode 3 is small in the first place. Accordingly, oxidation of molybdenum is not promoted, and it is possible to significantly reduce the probability that molybdenum turns into molybdenum oxide which would sublime in the temperature for annealing and turn into gas. As a result, it is possible to inhibit the circular flake-offs on the gate electrode.

Furthermore, in the method for fabricating the thin-film semiconductor device for display 10 according to the embodiment, the hydrogen plasma treatment is performed between the gate electrode forming process and the gate insulating film forming process. After patterning the gate electrode 3 by the wet etching, the concentration of oxygen at the interface of the gate electrode 3 is increased by the cleaning process in the etching. Accordingly, it is effective to perform the hydrogen plasma treatment immediately after the gate electrode 3 is formed. Furthermore, no process using moisture is necessary in a stage after forming the gate electrode 3 and before covering the gate electrode 3 with the gate insulating film 4. Accordingly, by performing the hydrogen plasma treatment between the gate electrode forming process and the gate insulating film forming process, it is possible to inhibit the oxygen entering the interface between the undercoat layer 2 and the gate electrode 3 again. Therefore, the gate electrode 3 is covered with the gate insulating film 4 in a state where the concentration of oxygen in the gate electrode 3 is significantly low. With this, the non-crystalline semiconductor layer 5a can be annealed in a state in which there is the smallest amount of oxygen at the interface between the undercoat layer 2 and the gate electrode 3.

Furthermore, in a stage between the gate electrode forming process and the gate insulating film forming process, the gate insulating film 4, the non-crystalline semiconductor layer 5a or another layer is not formed above the gate electrode 3. With this, it is possible to perform the hydrogen plasma treatment on the interface between the gate electrode 3 and the undercoat layer 2 through only one layer, that is, the patterned gate electrode 3.

As a result, it is possible to effectively reduce the amount of oxygen present in the interface between the undercoat layer 2 and the gate electrode 3 made of molybdenum most effectively. Accordingly, it is possible to inhibit the circular flake-offs on the gate electrode 3 to the maximum extent.

Furthermore, the annealing for crystallizing the non-crystalline semiconductor layer (non-crystalline silicon layer) is performed by the CW laser, and performed such that the temperature of the laser used for irradiating the non-crystalline semiconductor layer is higher than or equal to the melting temperature of non-crystalline silicon (1100° C.), and that the laser irradiation time on the non-crystalline semiconductor layer is 0.1 μsec.

Figure 6A:
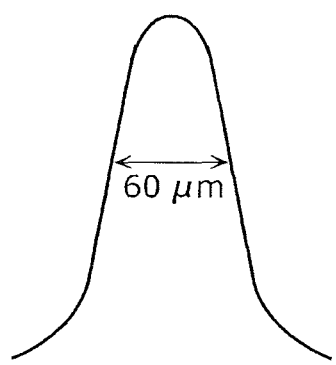
FIG. 6A illustrates a beam profile (short-axis) of a CW laser used for the annealing in the method for fabricating the thin-film semiconductor device for display according to the embodiment 1.
Figure 6B:
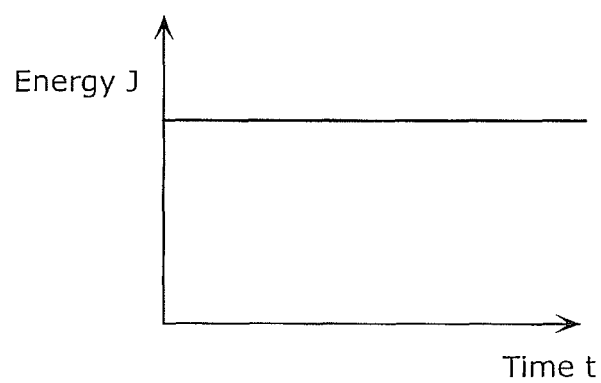
FIG. 6B illustrates an oscillation state of the laser when performing annealing using the CW laser illustrated in FIG. 6A.
Figure 7A:
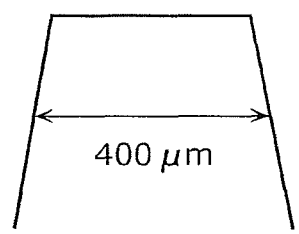
FIG. 7A illustrates a beam profile of a pulse laser used for the annealing in the method for fabricating the thin-film semiconductor device for display according to a comparative example.
Figure 7B:
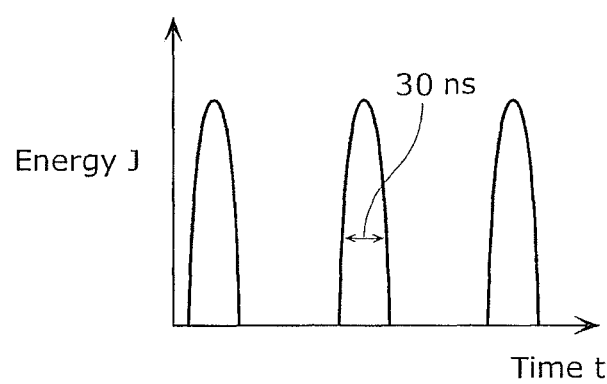
FIG. 7B illustrates an oscillation state of the laser when performing annealing using the pulse laser illustrated in FIG. 7A.

Here, the difference between the annealing using the CW laser and the annealing using the pulse laser shall be described with reference to FIG. 6A, FIG. 6B, FIG. 7A, and FIG. 7B. FIG. 6A illustrates a beam profile (short-axis) of the CW laser used for the laser annealing according to the embodiment 1. FIG. 6B illustrates an oscillation state of the laser when performing annealing using the CW laser illustrated in FIG. 6A. FIG. 7A illustrates a beam profile of the pulse laser. FIG. 7B illustrates an oscillation state of the laser when performing annealing using the pulse laser illustrated in FIG. 7A.

When crystallizing the non-crystalline semiconductor layer, if the annealing is performed using the CW layer as illustrated in FIG. 6A and FIG. 6B, the heat input time to the non-crystalline semiconductor layer is longer than the annealing using the pulse layer as illustrated in FIG. 7A and FIG. 7B.

For example, as illustrated in FIG. 6A, the non-crystalline silicon layer is irradiated with a CW laser that is a green laser having a Gaussian light intensity distribution and a full width at half maximum (FWHM) of 60 μm and a beam scanning speed (stage speed) of 480 mm/s. In this case, the heat input time on the non-crystalline silicon layer is 0.13 μsec.

In contrast, as illustrated in FIG. 7A, the excimer laser having a beam width of 400 μm is used as the pulse laser, and the non-crystalline silicon layer is irradiated with the laser having a pulse width of 30 nsec, as illustrated in FIG. 7B. In this case, the heat input time on the non-crystalline silicon layer is 0.003 μsec.

As described above, the laser annealing using the CW laser has the heat input time longer than the laser annealing using the pulse laser by approximately two orders. With this, the heat conduction region is longer in laser annealing using the CW laser. Accordingly, the temperature at the interface between the undercoat layer 2 and the gate electrode 3 increases, causing the flake-offs.

The present disclosure inhibits the flake-off generated when the CW laser is used. As described above, it is possible inhibit the oxidation of molybdenum in the gate electrode 3 by performing the hydrogen plasma treatment toward the undercoat layer 2 in at least a region on which the gate electrode 3 is formed.

As described above, according to the method for fabricating the thin-film semiconductor device for display 10 according to the embodiment 1, even when molybdenum is used as the material for the gate electrode 3, it is possible to inhibit the generation of molybdenum oxide. Accordingly, it is possible to inhibit the generation of the flake-off on the gate electrode 3 caused by the temperature for annealing, implementing the thin-film semiconductor device for display 10 having desired characteristics.

Note that, in the process for fabricating the thin-film semiconductor device for display, there is a case in which the hydrogen plasma treatment is performed in conventional technique. However, the hydrogen plasma treatment is for stabilizing the characteristics of the polycrystalline semiconductor layer 5p as the channel layer, for example. In the process before this stage, the hydrogen plasma treatment is not usually performed. According to the conventional techniques, no hydrogen plasma treatment at a level for reducing the concentration of oxygen between the undercoat layer 2 and the gate electrode 3 is performed. Note that, in the embodiment 1, hydrogen plasma treatment for stabilizing the characteristics of the non-crystalline semiconductor layer 6a is performed separately in the second non-crystalline semiconductor layer forming process.

(Results of Experiments According to the Present Disclosure)

Next, an experiment for testing the actions and effects of the method for fabricating the thin-film semiconductor device for display according to the embodiment was performed. The experiment results shall be described with reference to FIG. 8 and FIG. 9.

Figure 8:
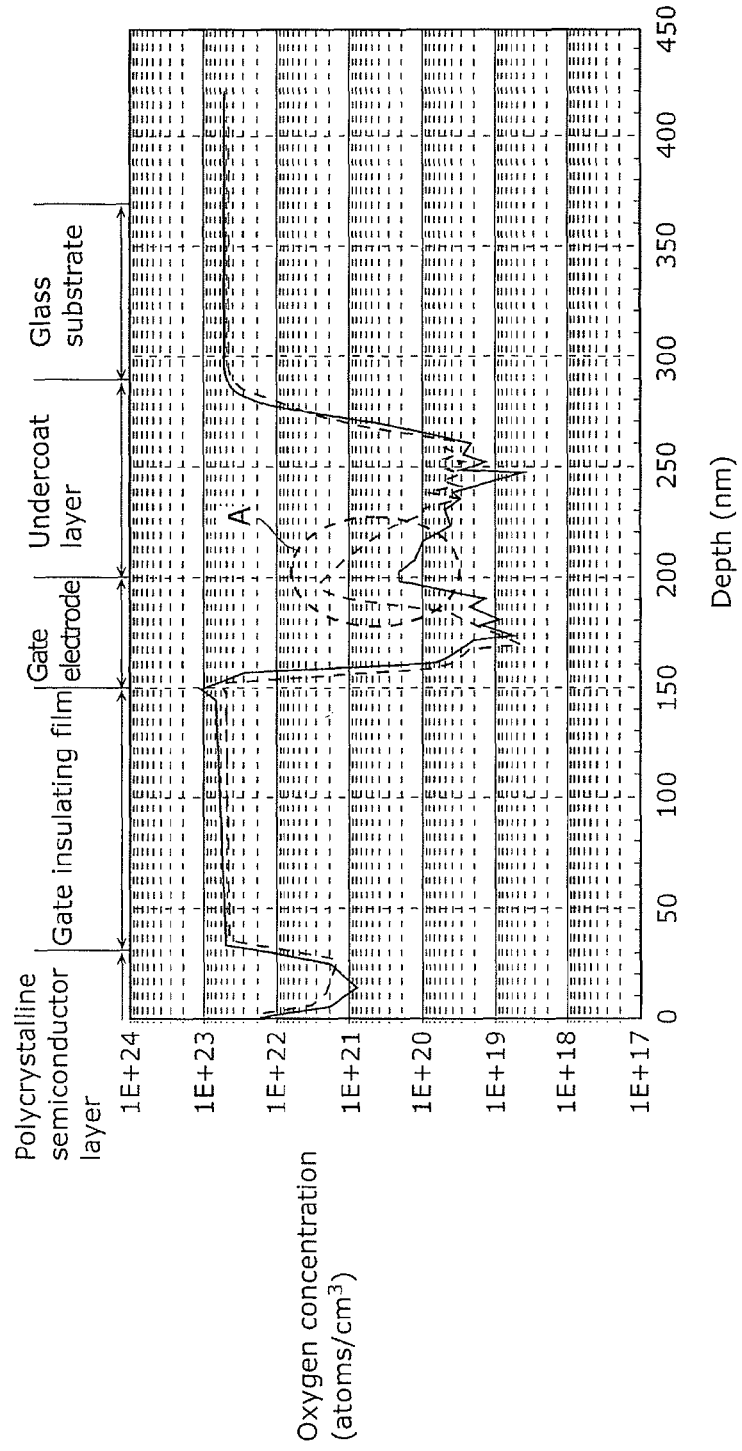
FIG. 8 illustrates concentration of oxygen in the thin-film semiconductor devices fabricated by the fabrication method according to the embodiment and the fabrication method according to a conventional example.

FIG. 8 illustrates oxygen concentration in the thin-film semiconductor devices fabricated by the fabrication method according to the embodiment and the fabrication method according to a conventional example. FIG. 8 is a graph which includes the concentration of oxygen in a thickness (depth) direction from the polycrystalline semiconductor layer to the glass substrate in the thin-film semiconductor device measured by the secondary ion mass spectrometry (SIMS) and plotted. In FIG. 8, the concentration of oxygen illustrated in the solid line is a case in which the thin-film semiconductor device was fabricated using the hydrogen plasma treatment (the present disclosure). The concentration of oxygen illustrated in the dotted line is a case in which the thin-film semiconductor device was fabricated without performing the hydrogen plasma treatment (conventional example). Note that, the hydrogen plasma treatment was performed in a chamber in which the glass substrate above which the gate electrode was formed on the undercoat layer was placed. A radio frequency power for the hydrogen plasma treatment had a power density of 0.262 (W/cm$^2$), and the processing time by the radio frequency power was 60 (s). As the materials for the components, the polycrystalline semiconductor layer was made of crystallized amorphous silicon, the gate insulating film was silicon dioxide, the gate electrode was molybdenum tungsten, and the undercoat layer was silicon nitride.

As illustrated in the area A surrounded by the broken line in FIG. 8, the concentration of oxygen at the interface between the undercoat layer and the gate electrode was $2.7 \times 10^{21}$ (atom/cm$^3$) in a conventional example without the hydrogen plasma treatment indicated by the dotted line. However, in the case of the present disclosure in which the hydrogen plasma treatment illustrated in the solid line was performed, the oxygen concentration was $2.1 \times 10^{20}$ (atom/cm$^3$). More specifically, the result shows that, the amount of oxygen at the interface between the undercoat layer and the gate electrode is significantly reduced in the case of the present disclosure in which the hydrogen plasma treatment indicated by the solid line was performed, compared to the conventional example without the hydrogen plasma treatment illustrated in the dotted line.

Figure 9:
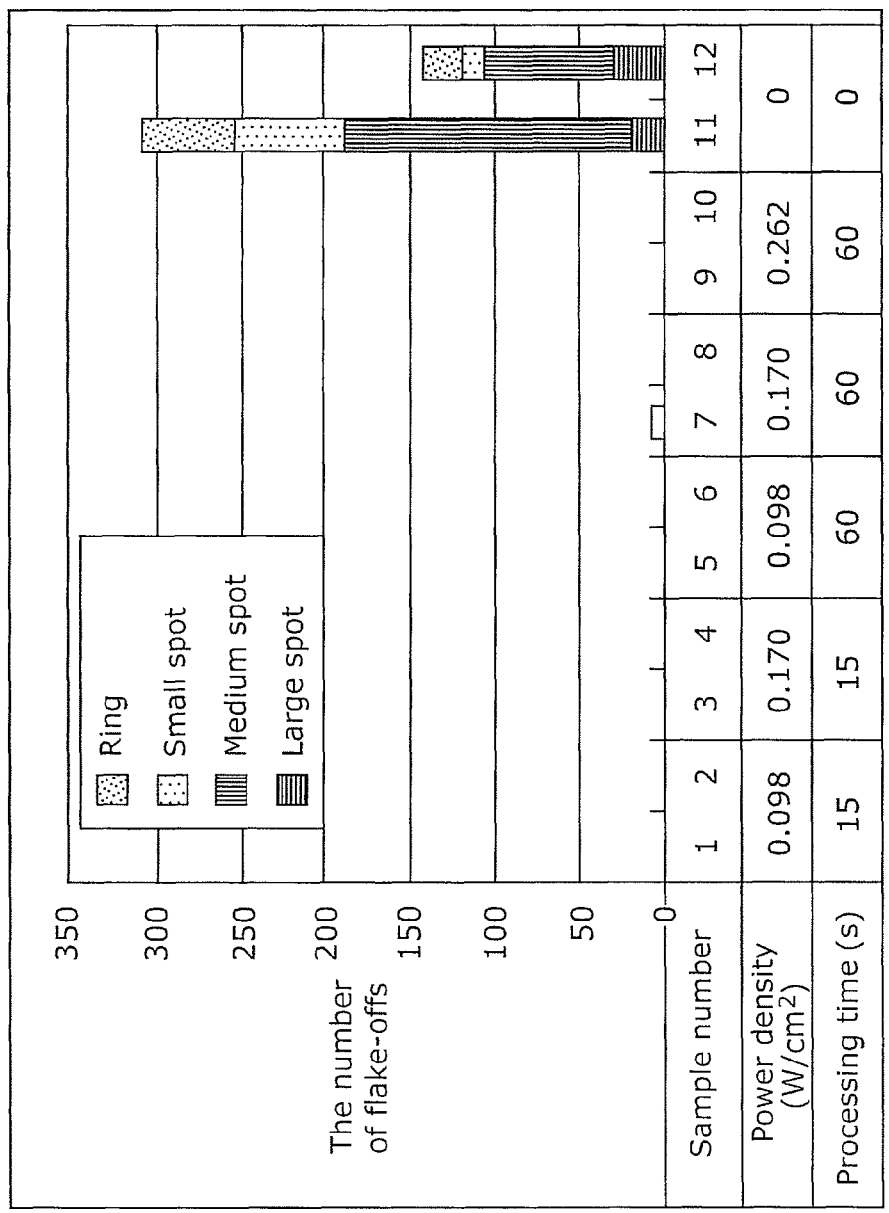
FIG. 9 illustrates a relationship between conditions for hydrogen plasma treatment and the number of flake-offs on the gate electrode.

FIG. 9 illustrates a relationship between conditions for hydrogen plasma treatment and the number of flake-offs on the gate electrode. The processing conditions for the hydrogen plasma treatment include a case in which the power density of the radio frequency power was 0.098 (W/cm$^2$) and a processing time was 15 (s), a case in which the power density was 0.170 (W/cm$^2$) and the processing time was 15 (s), a case in which the power density was 0.098 (W/cm$^2$) and the processing time was 60 (s), a case in which the power density was 0.170 (W/cm$^2$) and the processing time was 60 (s), and the power density was 0.262 (W/cm$^2$) and the processing time was 60 (s). Furthermore, in each processing condition, two samples were used. Note that, the case with the power density of 0 (W/cm$^2$) and the processing time of 0 (s) is a case in which the hydrogen plasma treatment was not performed. Furthermore, in FIG. 9, "ring" indicates the number of ring-shaped flake-offs on the gate electrode, and "small spot", "medium spot" and "large spot" indicate the numbers of small, medium, large spots on the gate electrode, respectively.

As illustrated in FIG. 9, when the hydrogen plasma treatment was performed, the flake-off was barely generated, regardless of the power density or the length of processing time. In contrast, when no hydrogen plasma treatment is performed, countless flake-offs were generated.

Accordingly, from the result of the experiment, by setting the power density of the radio frequency when performing the hydrogen plasma treatment in a range from 0.098 (W/cm$^2$) to 0.262 (W/cm$^2$) and the processing time by the radio frequency power in a range from 15 seconds to 60 seconds, the flake-off on the gate electrode is barely generated.

As described above, by the experiment result illustrated in FIG. 8 and FIG. 9, by performing the hydrogen plasma treatment, it is possible to reduce the concentration of oxygen present in the proximity of the interface between the undercoat layer and the gate electrode. With this, it is possible to inhibit the oxidation of molybdenum in the gate electrode. Accordingly, it is possible to inhibit the generation of the flake-off on the gate electrode.

Note that, in the embodiment, the concentration of oxygen atoms contained in the undercoat layer 2 is in a range from $1 \times 10^{18}$/cm$^3$ to $1 \times 10^{21}$/cm$^3$. Stated differently, it is assumed that the concentration of oxygen atoms contained in the undercoat layer 2 is reduced by performing the hydrogen plasma treatment.

Furthermore, the thickness of the undercoat layer 2 is preferably greater than or equal to 100 nm for inhibiting diffusion of sodium as described above. However, the thickness of the undercoat layer 2 is preferably greater than or equal to 400 nm for further improving the reliability of the film.

A pressure test was performed on five samples each of which includes a glass substrate and the undercoat layer 2 formed thereon. When the thickness of the undercoat layer 2 was 400 nm or 500 nm, no crack was found in the five samples. In contrast, when the thickness of the undercoat layer 2 was 300 nm, a crack was found in one of the five samples.

Accordingly, it is even more preferable to set the thickness of the undercoat layer 2 to be greater than or equal to 400 nm. Note that, in practical uses, the thickness of the undercoat layer 2 in the thin-film semiconductor device for display is preferably less than or equal to 600 nm.

Embodiment 2

Next, a method for fabricating a thin-film semiconductor device for display according to the embodiment 2 shall be described with reference to FIG. 10 and FIG. 11.

Figure 10:
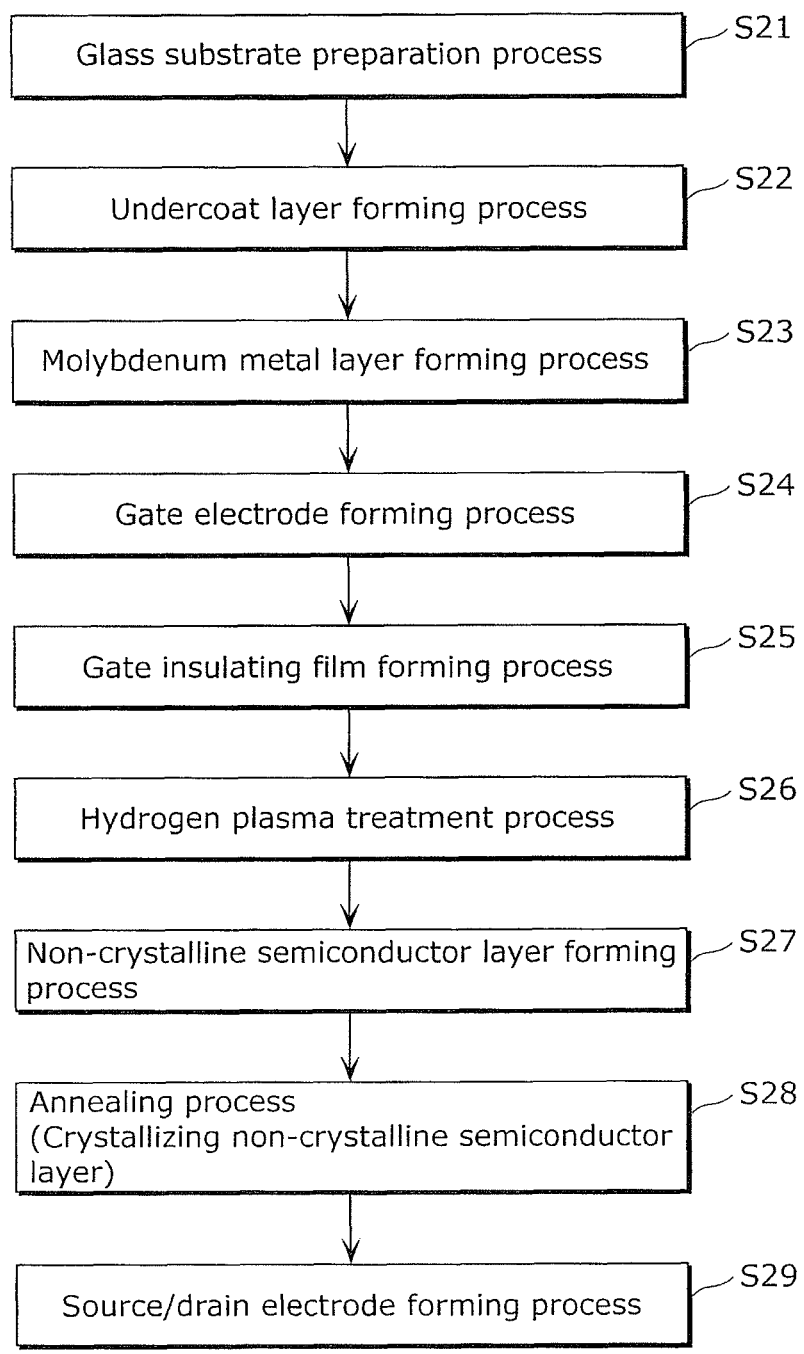
FIG. 10 is a flowchart illustrating a method for fabricating a thin-film semiconductor device for display according to the embodiment 2.

FIG. 10 is a flowchart illustrating the method for fabricating the thin-film semiconductor device for display according to the embodiment 2.

As illustrated in FIG. 10, the method for fabricating the thin-film semiconductor device for display according to the embodiment 2 includes at least a glass substrate preparation process (S21), an undercoat layer forming process (S22), a molybdenum metal layer forming process (S23), a gate electrode forming process (S24), a gate insulating film forming process (S25), a hydrogen plasma treatment process (S26), a non-crystalline semiconductor layer forming process (S27), an annealing process (S28), and a source/drain electrode forming process (S29) in order.

The method for fabricating the thin-film semiconductor device for display according to the embodiment 2 and the method for fabricating the thin-film semiconductor device according to the embodiment 1 are different in terms of the timing for performing the hydrogen plasma treatment. More specifically, in the method for fabricating the thin-film semiconductor device for display according to the embodiment 1, the hydrogen plasma treatment process (S15) is between the gate electrode forming process (S14) and the gate insulating film forming process (S16). In contrast, in the method for fabricating the thin-film semiconductor device according to the embodiment 2, the hydrogen plasma treatment process (S26) is between the gate insulating film forming process (S25) and the non-crystalline semiconductor layer forming process (S27).

Note that, the details of the processes in the fabrication method according to the embodiment 2 are identical to the processes according to the method for fabricating the thin-film semiconductor device for display according to the embodiment 1. Accordingly, the detailed description for the processes shall be omitted. Note that, the method for fabricating the thin-film semiconductor device according to the embodiment 2 includes processes in addition to the processes described above.

A specific method for fabricating the thin-film semiconductor device for display according to the embodiment 2 including the processes not described above shall be described in more detail with reference to FIG. 11. FIG. 11 is a cross-sectional view schematically illustrating characteristic processes among processes in the method for fabricating the thin-film semiconductor device for display according to the embodiment 2. Note that, in FIG. 11, the same reference numerals are used for referring the components identical to the components in the fabrication method according to the embodiment 1 illustrated in FIG. 3, and the detailed description for these components is omitted. The following description focuses on the difference from the fabrication method according to the embodiment 1 illustrated in FIG. 3 and FIG. 4.

Figure 11:
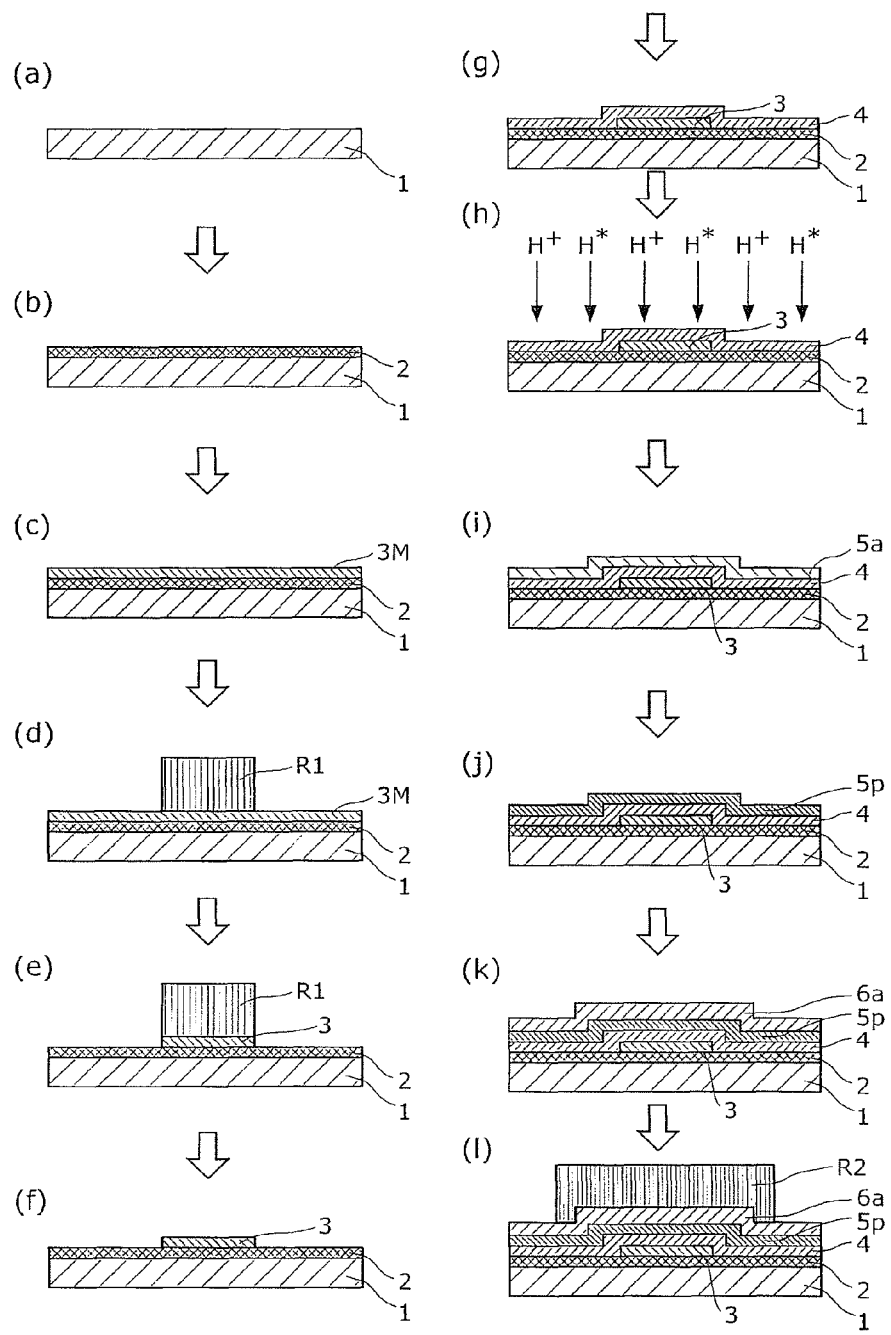
FIG. 11 is a cross-sectional view schematically illustrating characteristic processes among processes in the method for fabricating the thin-film semiconductor device for display according to the embodiment 2.

First, in the same manner as the fabrication method according to the embodiment in (a) to (f) in FIG. 3, the process (a) to (f) in FIG. 11 are sequentially performed. More specifically, the glass substrate preparation process, the undercoat layer forming process, the molybdenum metal layer forming process, and the gate electrode forming process are sequentially performed. Note that, the processes (a) to (f) in FIG. 11 are identical to the processes (a) to (f) in FIG. 3.

Next, as illustrated in (g) in FIG. 11, the gate insulating film 4 made of silicon dioxide having the thickness of approximately 100 nm is deposited on the gate electrode 3 and the undercoat layer 2 by the plasma CVD so as to cover the gate electrode 3. Note that, this process corresponds to the process in (h) in FIG. 3 according to the embodiment 1.

Next, the glass substrate 1 above which the gate electrode 3 and the gate insulating film 4 are formed on the undercoat layer 2 is placed in a chamber, and the hydrogen plasma treatment is performed toward the undercoat layer 2 at least on a region where the gate electrode 3 is formed (gate electrode forming region).

In this embodiment, the hydrogen plasma treatment is performed toward the interface between the undercoat layer 2 and the gate electrode 3, in the same manner as in the embodiment 1. With this, it is possible to reduce the concentration of oxygen present in the proximity of the interface between the undercoat layer 2 and the gate electrode 3. Note that, in this embodiment, although the gate insulating film 4 is formed on the gate electrode 3, hydrogen ions reach to a depth in an order of a few μm. Accordingly, it is possible to sufficiently reduce the concentration of oxygen inside and around the gate electrode 3.

Subsequently, in the same manner as the processes (i) to (l) in FIG. 3, the processes (i) to (l) in FIG. 11 are performed. The processes (i) to (l) in FIG. 11 are identical to the processes (i) to (l) in FIG. 3. After that, although not illustrated, the processes identical to (a) to (j) in FIG. 4 in the fabrication method according to the embodiment 1 are performed.

More specifically, after the hydrogen plasma treatment process, the first non-crystalline semiconductor layer forming process, the annealing process, the second non-crystalline semiconductor layer forming process, the channel layer island forming process, the contact layer forming film forming process, the source/drain electrode forming process, and the contact layer forming process/channel etching process are performed in order, in the same manner as the fabrication method according to the embodiment 1.

As described above, the method for fabricating the thin-film semiconductor device for display according to the embodiment 2 includes the process for performing the hydrogen plasma treatment before the annealing process for crystallizing the non-crystalline semiconductor layer, in the same manner as the method for fabricating the thin-film semiconductor device for display according to the embodiment 1. With this, it is possible to reduce the concentration of oxygen present in the proximity of the interface between the undercoat layer 2 and the gate electrode 3, thereby inhibiting the generation of molybdenum oxide. Accordingly, the probability that molybdenum oxide sublimes and turns into gas at the annealing temperature in the temperature range described above can be significantly reduced. Therefore, it is possible to inhibit the generation of circular flake-offs on the gate electrode 3.

Furthermore, in the method for fabricating the thin-film semiconductor device for display according to the embodiment 2, the hydrogen plasma treatment process is provided between the gate insulating film forming process and the first non-crystalline semiconductor layer forming process. When the hydrogen plasma treatment is performed at this stage, the gate electrode 3 has already been covered by the gate insulating film at the time of hydrogen plasma treatment. Accordingly, it is possible to inhibit oxygen entering the area in the proximity of the interface between the gate electrode 3 and the undercoat layer 2 again after this stage. Accordingly, the non-crystalline semiconductor layer 5a is annealed while maintaining a state in which the hydrogen plasma treatment is performed on the area in the proximity of the interface between the gate electrode 3 and the undercoat layer 2, that is, in a state in which the amount of oxygen layer near the interface between the gate electrode 3 and the undercoat layer 2 is small.

Thus, the oxidation of molybdenum is not promoted, inhibiting the generation of molybdenum oxide. This decreases the probability that molybdenum oxide sublimes and turns into gas. As a result, it is possible to inhibit the flake-offs on the gate electrode.

Note that, when performing the hydrogen plasma treatment in the embodiment 2, the hydrogen plasma treatment toward the area in the proximity of the interface between the gate electrode and the undercoat layer is performed via one layer of gate insulating film. Since the hydrogen plasma treatment is performed through a film of one layer, the effect of the hydrogen plasma treatment is reduced, compared to a case in which the hydrogen plasma treatment is performed only through the gate electrode, as in the embodiment 1. However, in practical use, even with the hydrogen plasma treatment at this stage can sufficiently reduce the amount of oxygen present in the area in the proximity of the undercoat layer and the gate electrode. Accordingly, it is possible to sufficiently inhibit the circular flake-offs on the gate electrode.

Furthermore, in this embodiment, when the power density of the radio frequency for performing the hydrogen plasma treatment is at least in a range from 0.098 (W/cm$^2$) to 0.262 (W/cm), and the processing time by the radio frequency power is at least in a range from 15 seconds to 60 seconds, the flake-off on the gate electrode is barely generated.

Embodiment 3

Next, a method for fabricating a thin-film semiconductor device for display according to the embodiment 3 shall be described with reference to FIG. 12 and FIG. 13.

Figure 12:
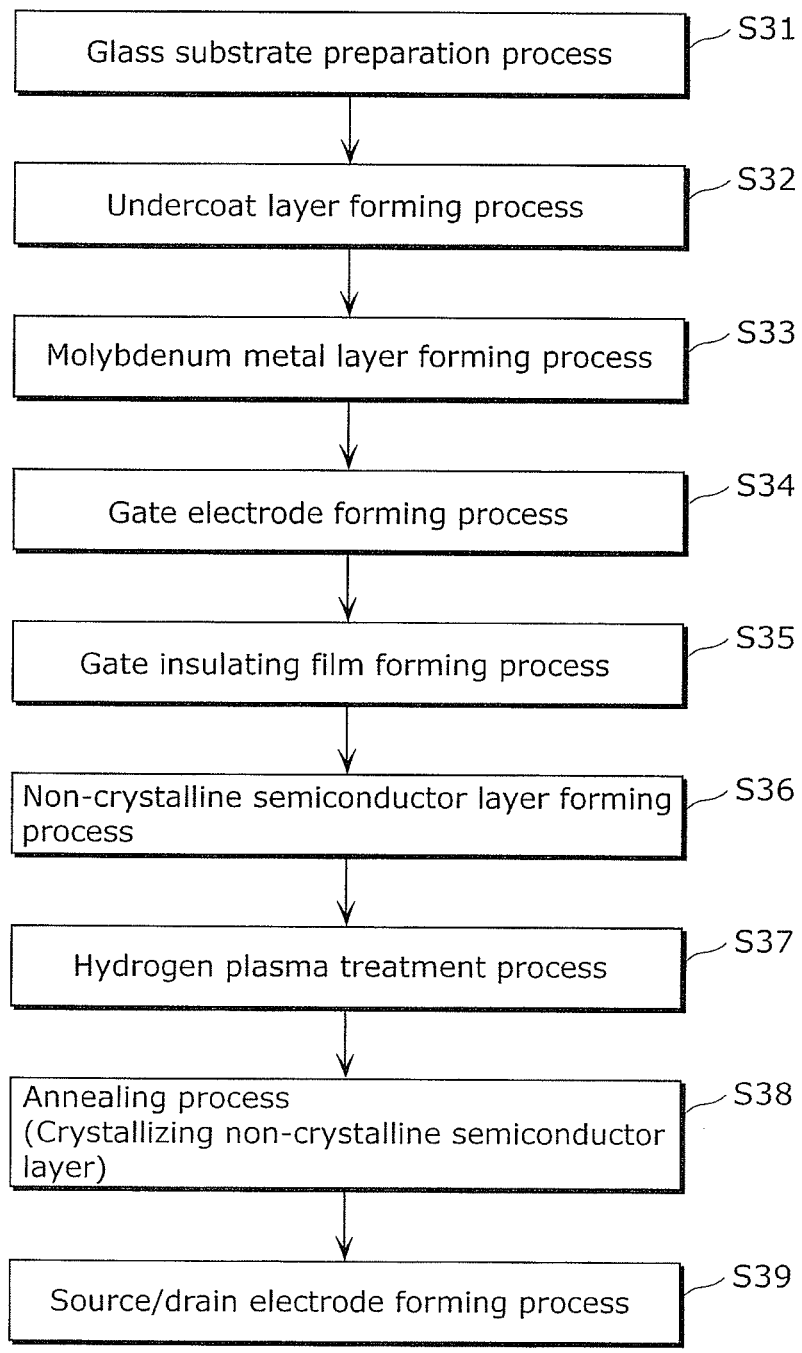
FIG. 12 is a flowchart illustrating a method for fabricating a thin-film semiconductor device for display according to the embodiment 3.

FIG. 12 is a flowchart illustrating the method for fabricating the thin-film semiconductor device for display according to the embodiment 3.

As illustrated in FIG. 12, the method for fabricating the thin-film semiconductor device for display according to the embodiment 3 includes at least a glass substrate preparation process (S31), an undercoat layer forming process (S32), a molybdenum metal layer forming process (S33), a gate electrode forming process (S34), a gate insulating film forming process (S35), a non-crystalline semiconductor layer forming process (S36), a hydrogen plasma treatment process (S37), an annealing process (S38), and a source/drain electrode forming process (S39) in order.

The method for fabricating the thin-film semiconductor device for display according to the embodiment 3 and the method for fabricating the thin-film semiconductor device according to the embodiment 1 are different in terms of the timing for performing the hydrogen plasma treatment as well. More specifically, in the method for fabricating the thin-film semiconductor device for display according to the embodiment 1, the hydrogen plasma treatment process (S15) is between the gate electrode forming process (S14) and the gate insulating film forming process (S16). In contrast, in the method for fabricating the thin-film semiconductor device according to the embodiment 3, the hydrogen plasma treatment process (S37) is between the non-crystalline semiconductor forming process (S36) and the annealing process (S38).

Note that, the details of the processes in the fabrication method according to the embodiment 2 are identical to the processes according to the method for fabricating the thin-film semiconductor device for display according to the embodiment 1. Accordingly, the detailed description shall be omitted. Note that, the method for fabricating the thin-film semiconductor device for display according to the embodiment 3 includes processes in addition to the processes described above.

A specific method for fabricating the thin-film semiconductor device for display according to the embodiment 3 including the processes not described above shall be described in more detail with reference to FIG. 13. FIG. 13 is a cross-sectional view schematically illustrating characteristic processes among processes in the method for fabricating the thin-film semiconductor device for display according to the embodiment 3. Note that, in FIG. 13, the same reference numerals are used for referring the components identical to the components in the fabrication method according to the embodiment 1 illustrated in FIG. 3, and the detailed description for these components is omitted. The following description focuses on the difference from the fabrication method according to the embodiment 1 illustrated in FIG. 3 and FIG. 4.

Figure 13:
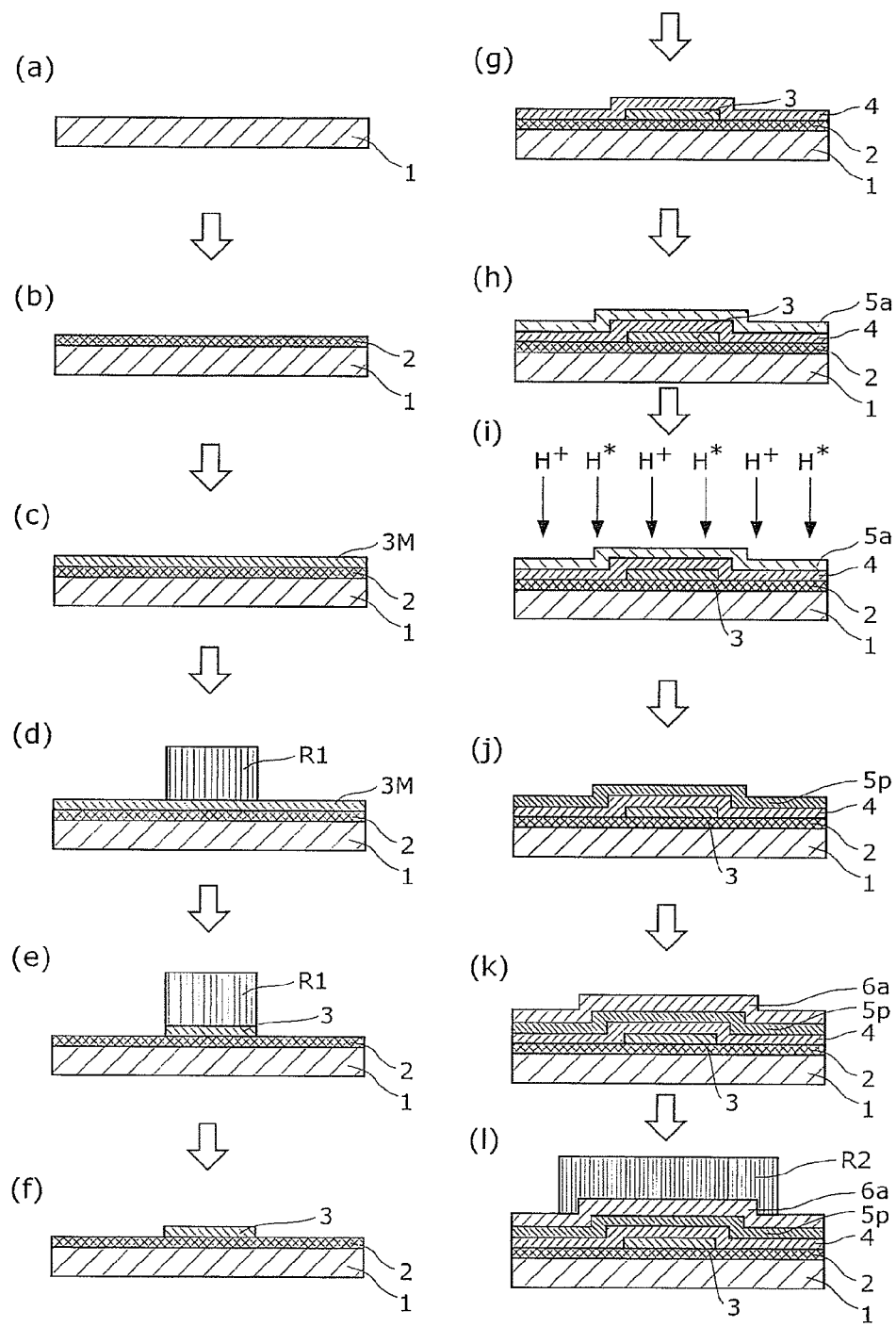
FIG. 13 is a cross-sectional view schematically illustrating characteristic processes among processes in the method for fabricating the thin-film semiconductor device for display according to the embodiment 3.

First, in the same manner as the fabrication method according to the embodiment in (a) to (f) in FIG. 3, the process (a) to (f) in FIG. 13 are sequentially performed. More specifically, the glass substrate preparation process, the undercoat layer forming process, the molybdenum metal layer forming process, and the gate electrode forming process are sequentially performed. Note that, the processes (a) to (f) in FIG. 13 are identical to the processes (a) to (f) in FIG. 3.

Next, as illustrated in (g) in FIG. 13, a gate insulating film 4 made of silicon dioxide having the thickness of approximately 100 nm is deposited on the gate electrode 3 and the undercoat layer 2 by the plasma CVD so as to cover the gate electrode 3. Note that, this process corresponds to the process in (h) in FIG. 3 according to the embodiment 1.

Next, as illustrated in (h) in FIG. 13, the non-crystalline semiconductor layer 5a made of a non-crystalline silicon layer is deposited on the gate insulating film 4 as the first non-crystalline semiconductor layer by the plasma CVD. Note that, this process corresponds to the process in (i) in FIG. 3 according to the embodiment 1. In this embodiment, the non-crystalline semiconductor layer 5a made of the non-crystalline silicon layer is an amorphous silicon layer, and is deposited to have the thickness of approximately 50 nm by the plasma CVD or others.

Next, the glass substrate 1 above which the layers up to the non-crystalline semiconductor layer 5a are formed is placed in a chamber, and the hydrogen plasma treatment is performed toward the undercoat layer 2 at least on a region where the gate electrode 3 is formed (gate electrode forming region), as illustrated in (i) in FIG. 13.

In this embodiment, the hydrogen plasma treatment is performed toward the interface between the undercoat layer 2 and the gate electrode 3, in the same manner as in the embodiment 1. With this, it is possible to reduce the concentration of oxygen present in the proximity of the interface between the undercoat layer 2 and the gate electrode 3. Note that, in this embodiment, although the gate insulating film 4 and the non-crystalline semiconductor layer 5a are formed on the gate electrode 3, hydrogen ions reach to a depth in an order of a few μm. Accordingly, it is possible to sufficiently reduce the concentration of oxygen inside and around the gate electrode 3.

Subsequently, in the same manner as the processes (j) to (l) in FIG. 3 according to the fabrication method in the embodiment 1, the processes (j) to (l) in FIG. 13 are performed. The processes (j) to (l) in FIG. 13 are identical to the processes (j) to (l) in FIG. 3. After that, although not illustrated, the processes identical to (a) to (j) in FIG. 4 in the fabrication method according to the embodiment 1 are performed.

More specifically, after the hydrogen plasma treatment process, the annealing process, the second non-crystalline semiconductor layer forming process, the channel layer island forming process, the contact layer forming film forming process, the source/drain electrode forming process, and the contact layer forming process/channel etching process are performed in order, in the same manner as the fabrication method according to the embodiment 1.

As described above, the method for fabricating the thin-film semiconductor device for display according to the embodiment 3 includes the process for performing the hydrogen plasma treatment before the annealing process for crystallizing the non-crystalline semiconductor layer, in the same manner as the method for fabricating the thin-film semiconductor device for display according to the embodiment 1. With this, it is possible to reduce the concentration of oxygen present in the proximity of the interface between the undercoat layer 2 and the gate electrode 3, thereby inhibiting the generation of molybdenum oxide. Accordingly, the probability that molybdenum oxide sublimes and turns into gas at the annealing temperature in the temperature range described above can be significantly reduced. Therefore, it is possible to inhibit the generation of circular flake-offs on the gate electrode 3.

Furthermore, in the method for fabricating the thin-film semiconductor device for display according to the embodiment 3, the hydrogen plasma treatment process is provided between the first non-crystalline semiconductor layer forming process and the annealing process. When the hydrogen plasma treatment is performed at this stage, the gate electrode 3 has already been covered by the gate insulating film 4 and the non-crystalline semiconductor layer 5a at the time of hydrogen plasma treatment. Accordingly, it is possible to inhibit of oxygen entering the area in the proximity of the interface between the gate electrode 3 and the undercoat layer 2 again after this stage. Accordingly, the non-crystalline semiconductor layer is annealed while maintaining a state in which the hydrogen plasma treatment is performed on the area in the proximity of the interface between the gate electrode 3 and the undercoat layer 2, that is, in a state in which the amount of oxygen near the interface between the gate electrode 3 and the undercoat layer 2 is small. Furthermore, the hydrogen plasma treatment can be performed immediately before the annealing. Accordingly, it is possible to effectively reduce the concentration of oxygen at an area in the proximity of the interface of the gate electrode.

Thus, the oxidation of molybdenum is not promoted, inhibiting the generation of molybdenum oxide. This decreases the probability that molybdenum oxide sublimes and turns into gas. As a result, it is possible to inhibit the flake-offs on the gate electrode 3.

Note that, when performing the hydrogen plasma treatment in the embodiment, the hydrogen plasma treatment toward the area in the proximity of the interface between the gate electrode and the undercoat layer is performed via two layers; the gate insulating film and the non-crystalline semiconductor layer. Since the hydrogen plasma treatment is performed through two layers of films, the effect of the hydrogen plasma treatment is reduced, compared to a case in which the hydrogen plasma treatment is performed only through one layer, the gate insulating film, as in the embodiment 2. However, in practical use, even the hydrogen plasma treatment at this stage can sufficiently reduce the amount of oxygen present in the area in the proximity of the undercoat layer and the gate electrode. Accordingly, it is possible to sufficiently inhibit the circular flake-offs on the gate electrode.

Furthermore, in this embodiment, when the power density of the radio frequency for performing the hydrogen plasma treatment is at least in a range from 0.098 (W/cm$^2$) to 0.262 (W/cm$^2$), and the processing time by the radio frequency power is at least in a range from 15 seconds to 60 seconds, the flake-off on the gate electrode is barely generated.

Embodiment 4

Next, a method for fabricating a thin-film semiconductor device for display according to the embodiment 4 shall be described with reference to FIG. 14 and FIG. 15.

Figure 14:
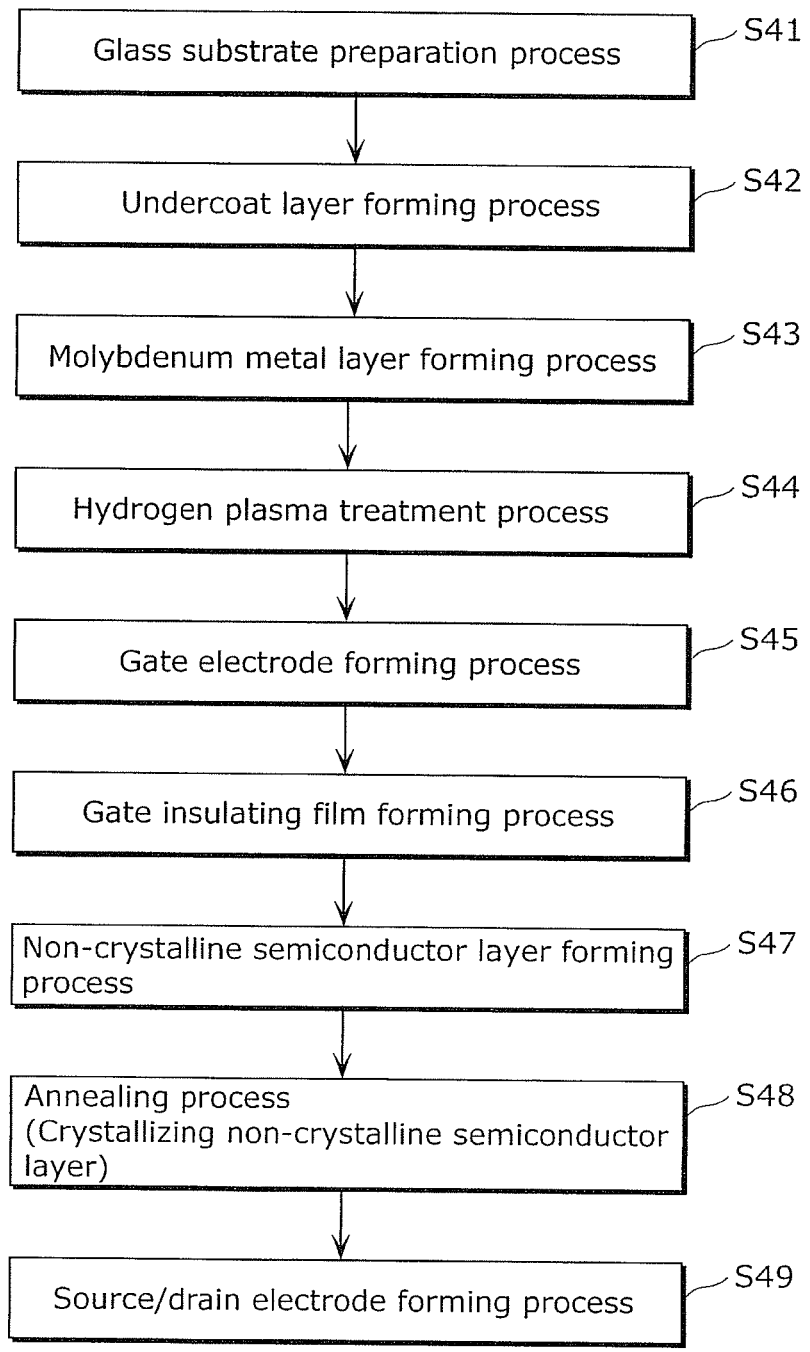
FIG. 14 is a flowchart illustrating a method for fabricating a thin-film semiconductor device for display according to the embodiment 4.

FIG. 14 is a flowchart illustrating the method for fabricating the thin-film semiconductor device for display according to the embodiment 4.

As illustrated in FIG. 14, the method for fabricating the thin-film semiconductor device for display according to the embodiment 4 includes at least a glass substrate preparation process (S41), an undercoat layer forming process (S42), a molybdenum metal layer forming process (S43), a hydrogen plasma treatment process (S44), a gate electrode forming process (S45), a gate insulating film forming process (S46), a non-crystalline semiconductor layer forming process (S47), an annealing process (S48), and a source/drain electrode forming process (S49) in order.

The method for fabricating the thin-film semiconductor device for display according to the embodiment 4 and the method for fabricating the thin-film semiconductor device according to the embodiment 1 are different in terms of the timing for performing the hydrogen plasma treatment as well. More specifically, in the method for fabricating the thin-film semiconductor device for display according to the embodiment 1, the hydrogen plasma treatment process (S15) is between the gate electrode forming process (S14) and the gate insulating film forming process (S16). In contrast, in the method for fabricating the thin-film semiconductor device according to the embodiment 4, the hydrogen plasma treatment process (S44) is between the molybdenum metal layer forming process (S43) and the gate electrode forming process (S45).

Note that, the details of the processes in the method for fabricating according to the embodiment 4 are identical to the processes according to the method for fabricating the thin-film semiconductor device for display according to the embodiment 1. Accordingly, the detailed description shall be omitted. Note that, the method for fabricating the thin-film semiconductor device according to the embodiment 4 includes processes in addition to the processes described above.

A specific method for fabricating the thin-film semiconductor device for display according to the embodiment 4 including the processes not described above shall be described in more detail with reference to FIG. 15. FIG. 15 is a cross-sectional view schematically illustrating characteristic processes among processes in the method for fabricating the thin-film semiconductor device for display according to the embodiment 4. Note that, in FIG. 15, the same reference numerals are used for referring the components identical to the components in the fabrication method according to the embodiment 1 illustrated in FIG. 3, and the detailed description for these components is omitted. The following description focuses on the difference from the fabrication method according to the embodiment 1 illustrated in FIG. 3 and FIG. 4.

Figure 15:
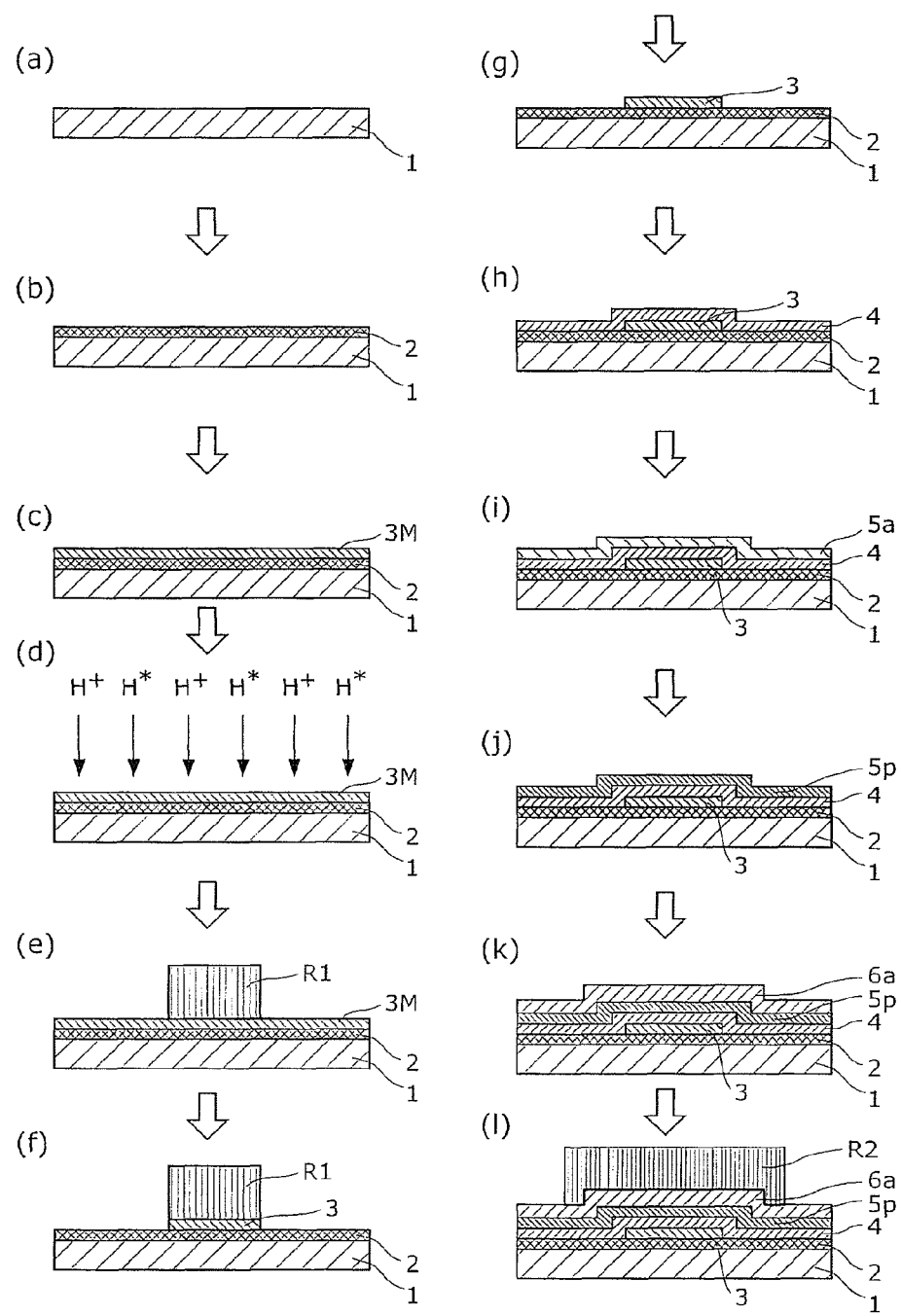
FIG. 15 is a cross-sectional view schematically illustrating characteristic processes among processes in the method for fabricating the thin-film semiconductor device for display according to the embodiment 4.

First, in the same manner as the fabrication method according to the embodiment in (a) to (c) in FIG. 3, the process (a) to (c) in FIG. 15 are sequentially performed. More specifically, the glass substrate preparation process, the undercoat layer forming process, and the molybdenum metal layer forming process are sequentially performed. Note that, the processes (a) to (c) in FIG. 15 are identical to the processes (a) to (c) in FIG. 3.

Next, the glass substrate 1 above which the molybdenum metal layer 3M is formed on the undercoat layer 2 is placed in a chamber, and the hydrogen plasma treatment is performed on the undercoat layer 2 at least on a region where the gate electrode 3 is to be formed (gate electrode forming region), as illustrated in (d) in FIG. 15. Stated differently, in the embodiment 4, the hydrogen plasma treatment is performed toward the interface between the undercoat layer 2 and the molybdenum metal layer 3M.

The hydrogen plasma treatment is performed in the same manner as the embodiment 1. With this, it is possible to reduce the concentration of oxygen present in the proximity of the undercoat layer 2 and the molybdenum metal layer 3M. Note that, in this embodiment, the molybdenum metal layer 3M is formed on the entire surface of the undercoat layer 2. However, the hydrogen radical reach to a depth of approximately 100 nm, and hydrogen ions even reach to a depth in an order of a few μm. Accordingly, it is possible to reduce the concentration of oxygen in the inside of the molybdenum metal layer 3M and an area in the proximity of the interface between the molybdenum metal layer 3M and the undercoat layer 2.

Next, as illustrated in (e) to (g) in FIG. 15, the gate electrode forming process is performed in the same manner as (d) to (f) in FIG. 3. More specifically, a resist R1 is selectively formed on the molybdenum metal layer 3M ((e) in FIG. 15), the molybdenum metal layer 3M is patterned by performing wet etching ((f) in FIG. 15) so as to form the gate electrode 3 in the predetermined shape ((g) in FIG. 15).

Subsequently, in the same manner as the processes (h) to (l) in FIG. 3, the processes (h) to (l) in FIG. 15 are performed. The processes (h) to (l) in FIG. 15 are identical to the processes (h) to (l) in FIG. 3. After that, although not illustrated, the processes identical to (a) to (j) in FIG. 4 in the fabrication method according to the embodiment 1 are performed.

More specifically, after the hydrogen plasma treatment process, the gate insulating film forming process, the first non-crystalline semiconductor layer forming process, the annealing process, the second non-crystalline semiconductor layer forming process, the channel layer island forming process, the contact layer forming film forming process, the source/drain electrode forming process, and the contact layer forming process/channel etching process are performed in order.

As described above, the method for fabricating the thin-film semiconductor device for display according to the embodiment 4 includes the process for performing the hydrogen plasma treatment before the annealing process for crystallizing the non-crystalline semiconductor layer, in the same manner as the method for fabricating the thin-film semiconductor device for display according to the embodiment 1. With this, it is possible to reduce the concentration of oxygen in an area in the proximity of the interface between the undercoat layer 2 and the molybdenum metal layer 3M. Accordingly, it is possible to reduce the concentration of oxygen in the area in the proximity of the interface between the undercoat layer 2 and the gate electrode 3 which is subsequently formed. Accordingly, it is possible to inhibit the generation of molybdenum oxide. Accordingly, the probability that molybdenum oxide sublimes and turns into gas at the annealing temperature in the temperature range described above can be significantly reduced. Therefore, it is possible to inhibit the generation of circular flake-offs on the gate electrode 3.

Note that, if the hydrogen plasma treatment is performed between the molybdenum metal layer forming process and the gate electrode forming process as illustrated in the embodiment 4, a process involving moisture is performed in a subsequent process. For example, cleaning using water is performed in when developing or removing resist, or when etching the metal layer or the metal film.

For this reason, if the hydrogen plasma treatment is performed at a stage before the gate electrode forming process, there is a possibility that the oxygen reenters the interface between the undercoat layer 2 and the gate electrode 3 again in a subsequent process.

However, even if the oxygen enters the interface in the subsequent processes, the hydrogen plasma treatment at this stage inhibits the generation of molybdenum oxide. Accordingly, even if the non-crystalline semiconductor layer is annealed afterward, it is possible to reduce the probability that molybdenum oxide sublimes and turns into gas. As a result, it is possible to inhibit the flake-offs on the gate electrode 3.

Furthermore, in this embodiment, when the power density of the radio frequency for performing the hydrogen plasma treatment is at least in a range from 0.098 (W/cm$^2$) to 0.262 (W/cm), and the processing time by the radio frequency power is at least in a range from 15 seconds to 60 seconds, the flake-off on the gate electrode is barely generated.

Embodiment 5

Next, the display device according to the embodiment 5 in which the thin-film semiconductor device for display according to the embodiments 1 to 4 is used in a display shall be described with reference to FIG. 16. Note that, in an aspect of the display device according to the embodiment 5, an example in which the display device is applied to an organic EL display shall be described.

Figure 16:
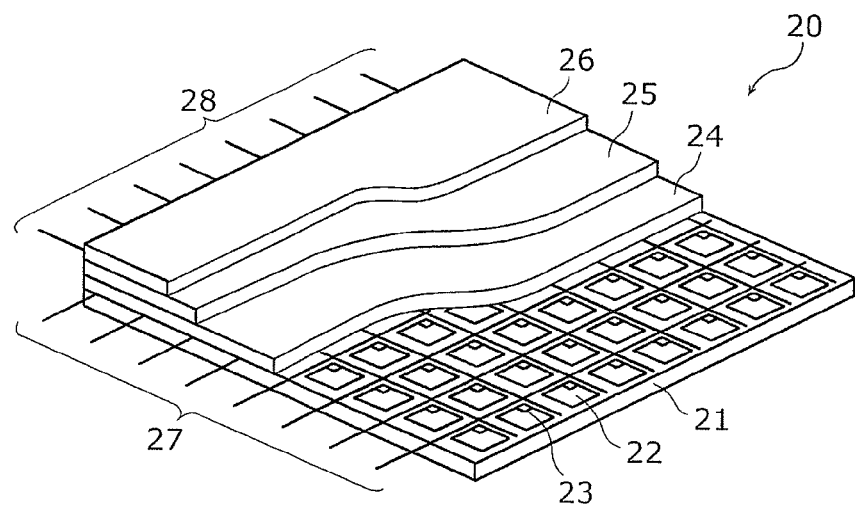
FIG. 16 is a partial cutout perspective view of an organic EL display according to the embodiment 5.

FIG. 16 is a partial cutout perspective view of an organic EL display according to the embodiment 5. The thin-film semiconductor device for display according to each of the embodiments may be used as the switching device for an active matrix substrate in the organic EL display.

As illustrated in FIG. 16, an organic EL display 20 includes an active matrix substrate 21, pixels 22 arranged in a matrix on the active matrix substrate 21, pixel circuits 23 connected to the pixels 22 and arranged in an array on the active matrix substrate 21, an anode 24, an organic EL layer 25, and a cathode 26 (transparent electrode) sequentially stacked on the pixels 22 and the pixel circuits 23, and source lines 27 and gate lines 28 connecting the pixel circuits 23 and a control circuit (not illustrated). The organic EL layer 25 is formed by stacking layers such as an electron transport layer, a light-emitting layer, a hole transport layer, and others.

In the organic EL display 20, the thin-film semiconductor device for display in one of the embodiments is provided for each of the pixel circuits 23.

Figure 17:
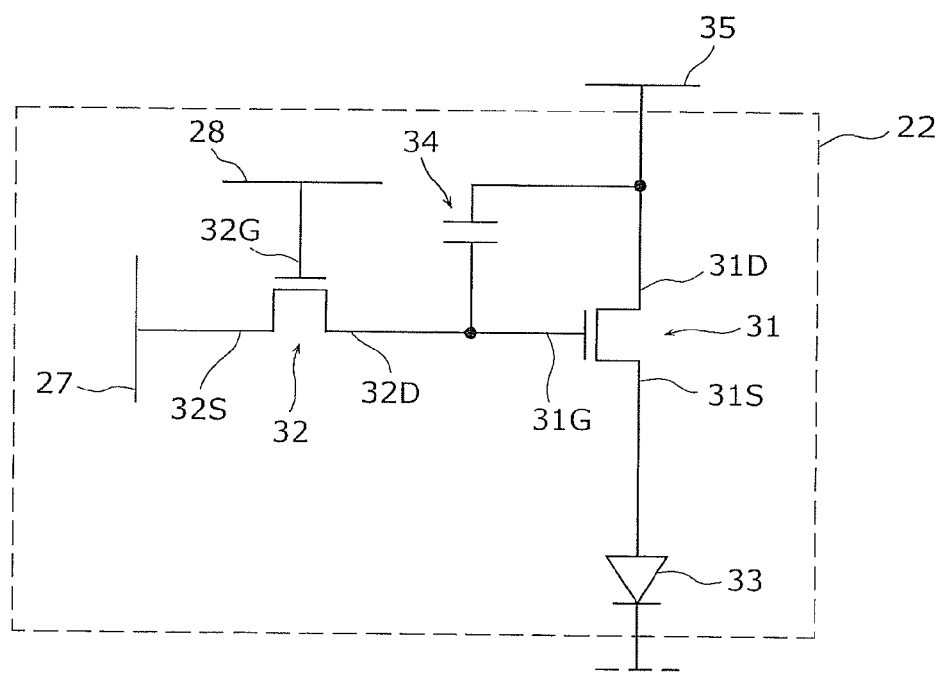
FIG. 17 is a circuit configuration diagram of a pixel using a thin-film semiconductor device for display according to the embodiments.

Next, the circuit configuration of each of the pixels 22 in the organic EL display 20 shall be described with reference to FIG. 17. FIG. 17 is a circuit configuration diagram of the pixel using the thin-film semiconductor device for display according to the embodiments 1 to 5 of the present disclosure.

As illustrated in FIG. 17, the pixel 22 includes a thin-film semiconductor device 31 for driving, a thin-film semiconductor device 32 for selecting, an organic EL device 33, and a capacitor 34. The thin-film semiconductor device 31 for driving is a driving transistor for driving the organic EL device 33, and the thin-film semiconductor device 32 for selecting is a switching transistor for selecting a pixel to which a video signal is to be supplied.

A source electrode 32S in the thin-film semiconductor device 32 for selecting is connected to the source line 27, and a gate electrode 32G is connected to the gate line 28, and a drain electrode 32D is connected to a capacitor 34 and a gate electrode 31G of the thin-film semiconductor device 31 for driving.

Furthermore, the drain electrode 31D in the thin-film semiconductor device 31 for driving is connected to the power supply line 35, and a source electrode 31S is connected to the anode of the organic EL device 33.

With this configuration, a gate signal is input to the gate line 28, turning on the thin-film semiconductor device 32 for selection. Subsequently, signal voltage supplied through the source line 27 is written on the capacitor 34. The holding voltage written on the capacitor 34 is held for one frame period. By the holding voltage, the conductance of the thin-film semiconductor device 31 for driving changes in an analog manner, and driving current corresponding to the tone of emitted light flows from the anode of the organic EL device 33 to the cathode of the organic EL device 33. With this current, the organic EL device 33 emits light, and an image is displayed.

Note that, the thin-film semiconductor devices for display according to the embodiments 1 to 4 may be applied to both the thin-film semiconductor device 31 for driving and the thin-film semiconductor device 32 for selecting.

The display according to an aspect of the present disclosure has been described above. However, the present disclosure is not limited to the display. For example, in the embodiment, the organic EL display using an organic EL device has been described. However, the present disclosure is applicable to a display including other display devices using an active matrix substrate such as a liquid crystal display device.

Furthermore, the display according to the embodiment 5 can be used as a flat-panel display, and is applicable to any display device such as a television set, a personal computer, a mobile phone, and others.

The method for fabricating the thin-film semiconductor device for display according to the present disclosure has been described with reference to the embodiments. The method for fabricating thin-film semiconductor device according to the present disclosure is not limited to the embodiments.

For example, in the embodiments described above, the hydrogen plasma treatment is performed only once in each embodiment. However, the hydrogen plasma treatment may be performed for multiple times as if the embodiments are combined.

In the embodiments described above, the undercoat layer 2 is a single-layer silicon nitride film. However, it is not limited to this example. The undercoat layer 2 may be configured to include a nitride film, and a silicon oxynitride film maybe used as the nitride film instead of the silicon nitride film.

Furthermore, the gate insulating film may be a stacked structure including silicon nitride (lower layer) and silicon dioxide (upper layer). However, since the polysilicon layer is used as the channel layer, a single-layer silicon oxide is used as the gate insulating film, for example. This is because, although the stacked structure of silicon nitride and silicon dioxide inhibits the flake-off on the gate electrode, the threshold voltage shifts to a negative side if the stacked structure is used.

Those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The thin-film semiconductor device for display according to the present disclosure can be widely used for display devices such as a television set, a personal computer, a mobile phone and others, or for various electric appliances as a switching device or others.

The invention claimed is:

1. A method for fabricating a thin-film semiconductor device for display, the method comprising:
preparing a glass substrate;
forming, above the glass substrate, an undercoat layer for inhibiting diffusion of an impurity in the glass substrate, the undercoat layer including a nitride film;
forming a metal layer comprising molybdenum above the undercoat layer;
forming a gate electrode from the metal layer by a predetermined etching process;
forming a gate insulating film above the gate electrode;
forming a non-crystalline silicon layer above the gate insulating film;
forming a polysilicon layer by annealing the non-crystalline silicon layer at a temperature in a range from 700° C. to 1400° C., the non-crystalline silicon layer being crystallized by the annealing;
forming a source electrode and a drain electrode above the polysilicon layer; and
performing hydrogen plasma treatment at least once at a stage after the metal layer is formed and before the polysilicon layer is formed, the hydrogen plasma treatment being performed toward at least a region in the undercoat layer on which the gate electrode is formed,
wherein a radio frequency power when performing the hydrogen plasma treatment is in a range from 0.098 W/cm$^2$ to 0.262 W/cm$^2$.

2. The method for fabricating the thin-film semiconductor device for display according to claim 1,
wherein the undercoat layer has a thickness of at least 100 nm.

3. The method for fabricating the thin-film semiconductor device for display according to claim 1,
wherein the undercoat layer has a thickness of at least 400 nm.

4. The method for fabricating the thin-film semiconductor device for display according to claim 1,
wherein a concentration of oxygen atoms in the undercoat layer is in a range from $1\times10^{18}/cm^3$ to $1\times10^{21}/cm^3$.

5. The method for fabricating the thin-film semiconductor device for display according to claim 1,
wherein when performing the hydrogen plasma treatment, a processing time using the radio frequency power is in a range from 15 seconds to 60 seconds.

6. The method for fabricating the thin-film semiconductor device for display according to claim 1,
wherein the hydrogen plasma treatment is performed toward an interface between the undercoat layer and the gate electrode.

7. The method for fabricating the thin-film semiconductor device for display according to claim 6,
wherein the hydrogen plasma treatment is treatment for reducing a concentration of oxygen in proximity of the interface between the undercoat layer and the gate electrode.

8. The method for fabricating the thin-film semiconductor device for the display according to claim 1,
wherein the impurity in the glass substrate is sodium or phosphorus.

9. The method for fabricating the thin-film semiconductor device for display according to claim 1,
wherein the glass substrate contains oxygen atoms as a major component,
the undercoat layer has a force for bonding with oxygen atoms that is weaker than the glass substrate, and
the molybdenum has a force for bonding with oxygen atoms that is weaker than the glass substrate and stronger than the undercoat layer.

10. The method for fabricating the thin-film semiconductor device for display according to claim 1, the method further comprising
forming a second non-crystalline silicon layer above the polysilicon layer between forming the polysilicon layer and forming the source electrode and drain electrode,
wherein the source electrode and the drain electrode are formed above the second non-crystalline silicon layer.

11. The method for fabricating the thin-film semiconductor device for display according to claim 1,
wherein the polysilicon layer includes a microcrystalline silicon layer having an average grain size in a range from 20 nm to 200 nm.

12. The method for fabricating the thin-film semiconductor device for display according to claim 1,
wherein the hydrogen plasma treatment is performed between forming the gate electrode and forming the gate insulating film.

13. The method for fabricating the thin-film semiconductor device for display according to claim 1,
wherein the hydrogen plasma treatment is performed between forming the gate insulating film and forming the non-crystalline silicon layer.

14. The method for fabricating the thin-film semiconductor device for display according to claim 1,
wherein the hydrogen plasma treatment is performed between forming the non-crystalline silicon layer and forming the polysilicon layer.

15. The method for fabricating the thin-film semiconductor device for display according to claim 1,
wherein the hydrogen plasma treatment is performed between forming the metal layer and forming the gate electrode.

16. The method for fabricating the thin-film semiconductor device for display according to claim 1,
wherein when forming the polysilicon layer, the non-crystalline silicon layer is annealed using a continuous wave laser.

* * * * *